(12) United States Patent
Ikura

(10) Patent No.: US 9,589,843 B2
(45) Date of Patent: Mar. 7, 2017

(54) METHOD FOR MANUFACTURING A SEMICONDUCTOR DEVICE

(71) Applicant: RENESAS ELECTRONICS CORPORATION, Tokyo (JP)

(72) Inventor: Junji Ikura, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/063,026

(22) Filed: Mar. 7, 2016

(65) Prior Publication Data

US 2016/0293452 A1 Oct. 6, 2016

(30) Foreign Application Priority Data

Mar. 31, 2015 (JP) .................. 2015-073049

(51) Int. Cl.
*H01L 21/78* (2006.01)
*H01L 21/56* (2006.01)
*H01L 23/495* (2006.01)
*H01L 23/31* (2006.01)

(52) U.S. Cl.
CPC ............ *H01L 21/78* (2013.01); *H01L 21/565* (2013.01); *H01L 23/49541* (2013.01); *H01L 23/49582* (2013.01); *H01L 23/3107* (2013.01); *H01L 2224/05554* (2013.01); *H01L 2224/48091* (2013.01); *H01L 2224/48247* (2013.01); *H01L 2224/48465* (2013.01); *H01L 2224/49171* (2013.01); *H01L 2224/73265* (2013.01); *H01L 2924/181* (2013.01)

(58) Field of Classification Search
CPC .................................................. H01L 21/4825
See application file for complete search history.

(56) References Cited

U.S. PATENT DOCUMENTS 3,399,302 A * 8/1968 Carrell ...................... G01T 1/20
250/367
5,093,281 A * 3/1992 Eshima ................... H01L 21/50
174/529

(Continued)

FOREIGN PATENT DOCUMENTS

| JP | 04-096261 A | 3/1992 |
| JP | 06-037231 A | 2/1994 |
| JP | 11-220087 A | 8/1999 |
| JP | 2005-347769 A | 12/2005 |
| JP | 2011-258680 A | 12/2011 |

*Primary Examiner* — Calvin Choi
*Assistant Examiner* — S.M. S Imtiaz
(74) *Attorney, Agent, or Firm* — McDermott Will & Emery LLP

(57) ABSTRACT

The manufacturing efficiency of a semiconductor device is improved. A method for manufacturing a semiconductor device includes a step of sealing a semiconductor chip using a mold die having a cavity, a gate part communicating with the cavity, and a vent part provided opposite to the gate part via the cavity, and extending in a first direction in a sealing step. Further, a lead frame has a first through hole provided at a position overlapping the cavity in the sealing step, and a second through hole provided outside the first through hole, and provided at a position overlapping the vent part in the sealing step. Whereas, in a second direction crossing with the first direction, the length of the second through hole is larger than the length (groove width) of the vent part.

16 Claims, 27 Drawing Sheets

(56) References Cited

U.S. PATENT DOCUMENTS

| | | | | |
|---|---|---|---|---|
| 5,334,872 A * | 8/1994 | Ueda | ............ | H01L 21/565 |
| | | | | 257/666 |
| 5,750,153 A * | 5/1998 | Shibata | ............ | B29C 45/14655 |
| | | | | 425/116 |
| 5,939,792 A * | 8/1999 | Ishikawa | ............ | H01L 23/3135 |
| | | | | 257/787 |
| 6,498,099 B1 * | 12/2002 | McLellan | ............ | H01L 21/4832 |
| | | | | 257/E23.043 |
| 6,724,072 B2 * | 4/2004 | Ochiai | ............ | H01L 21/565 |
| | | | | 257/667 |
| 7,371,610 B1 * | 5/2008 | Fan | ............ | H01L 21/561 |
| | | | | 257/E21.499 |
| 7,482,690 B1 * | 1/2009 | Fan | ............ | H01L 21/4832 |
| | | | | 257/690 |
| 8,399,302 B2 * | 3/2013 | Tanaka | ............ | H01L 21/566 |
| | | | | 257/666 |
| 2003/0201525 A1 * | 10/2003 | James | ............ | H01L 21/561 |
| | | | | 257/686 |
| 2006/0154403 A1 * | 7/2006 | McLellan | ............ | H01L 21/4832 |
| | | | | 438/113 |
| 2009/0278250 A1 * | 11/2009 | Tong | ............ | H01L 21/565 |
| | | | | 257/692 |
| 2012/0009737 A1 * | 1/2012 | Kuratomi | ............ | H01L 21/561 |
| | | | | 438/112 |
| 2013/0299956 A1 * | 11/2013 | Narita | ............ | H01L 21/561 |
| | | | | 257/676 |
| 2014/0117403 A1 * | 5/2014 | Hayashi | ............ | H01L 33/62 |
| | | | | 257/99 |

* cited by examiner

METHOD FOR MANUFACTURING A SEMICONDUCTOR DEVICE

CROSS-REFERENCE TO RELATED APPLICATIONS

The disclosure of Japanese Patent Application No. 2015-073049 filed on Mar. 31, 2015 including the specification, drawings and abstract is incorporated herein by reference in its entirety.

BACKGROUND

The present invention relates to, for example, a manufacturing technology of a semiconductor device in which a semiconductor chip mounted at a lead frame is sealed with a resin.

Japanese Unexamined Patent Application Publication No. Hei 6(1994)-37231 (Patent Document 1), and Japanese Unexamined Patent Application Publication No. 2005-347769 (Patent Document 2) describe as follows: a through hole is formed at a position of the lead frame overlapping the groove for air vent provided at a die for forming a sealing body.

Whereas, Japanese Unexamined Patent Application Publication No. Hei 4 (1992)-96261 (Patent Document 3) describes as follows: a broad part for air vent is provided at a position in the opening provided at the corner part of the package of the lead frame overlapping the air vent part of the mold die, thereby to prevent leakage of a resin into the opening.

Japanese Unexamined Patent Application Publication No. Hei 11(1999)-220087 (Patent Document 4), and Japanese Unexamined Patent Application Publication No. 2011-258680 (Patent Document 5) describe a structure in which a groove for air vent is formed in the lead frame.

PATENT DOCUMENTS

[Patent Document 1] Japanese Unexamined Patent Application Publication Hei 6(1994)-37231
[Patent Document 2] Japanese Unexamined Patent Application Publication No. 2005-347769
[Patent Document 3] Japanese Unexamined Patent Application Publication Hei 4(1992)-96261
[Patent Document 4] Japanese Unexamined Patent Application Publication No. Hei 11(1999)-220087
[Patent Document 5] Japanese Unexamined Patent Application Publication No. 2011-258680

SUMMARY

The present inventors present a technology of sealing a semiconductor chip mounted at a lead frame with a resin using a mold die as a manufacturing technology of a semiconductor device. The mold die has a cavity for arranging a semiconductor chip therein, a gate part for feeding a resin into the cavity, and a vent part for discharging the gas, or the like in the cavity to the outside.

However, in the sealing step, the resin overflowed from cavity may leak into the vent part. At this step, when the resin leaked in the vent part is cured, it becomes difficult to extract the residual resin from the mold die. This causes the reduction of the manufacturing efficiency of the semiconductor device.

Other objects and novel features will be apparent from the description of this specification and the accompanying drawings.

A method for manufacturing a semiconductor device in accordance with one embodiment includes a step of sealing a semiconductor chip using a mold die having a cavity, a gate part communicating with the cavity, and a vent part provided opposite to the gate part via the cavity, and extending in a first direction in the sealing step. Whereas, a lead frame for mounting the semiconductor chip thereover has a first through hole provided at a position overlapping the cavity in the sealing step, and a second through hole provided outside the first through hole, and provided at a position overlapping the vent part in the sealing step. Further, in a second direction crossing with the first direction, the length of the second through hole is larger than the length of the vent part.

In accordance with the one embodiment, it is possible to improve the manufacturing efficiency of a semiconductor device.

Figure 1:
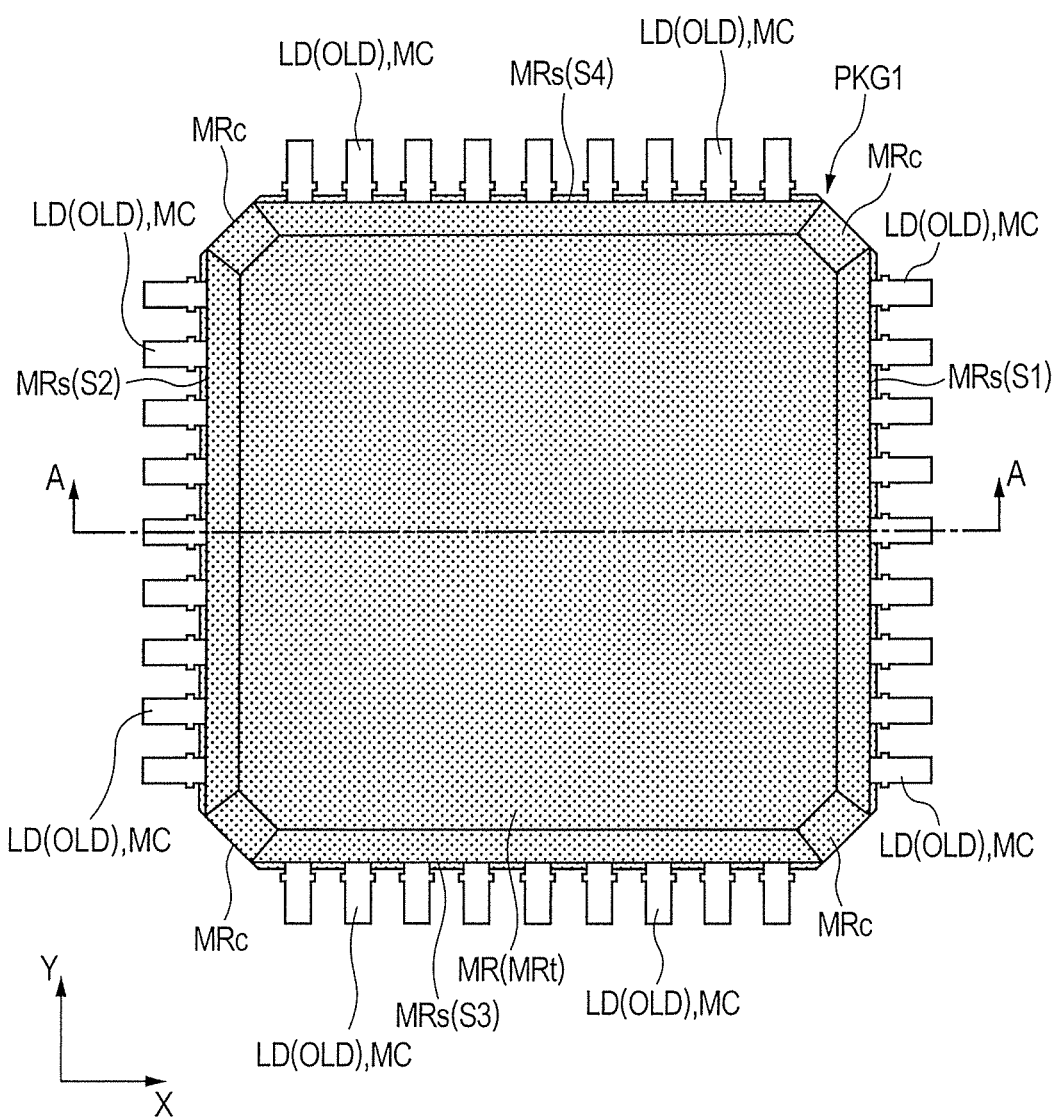
FIG. 1 is a top view of a semiconductor device of one embodiment.

DETAILED DESCRIPTION (Explanation of Description Form, Basic Terms, and Methods in the Present Application)

In the present application, in the following description of embodiments, the description may be divided into a plurality of sections, or the like for convenience, if required. However, unless otherwise specified, these are not independent of each other, but, are respective parts of a single example, in a relation such that one is a detailed explanation of a part of the other, a modification example of a part or the whole, or the like of the other, irrespective of the order of description. Further, in principle, the repetitive description of the same parts will be omitted. Whereas, respective constitutional elements in embodiments are not essential, unless otherwise specified, or except for the case where the number is theoretically limiting, and unless otherwise apparent from the context.

Similarly, in the description of embodiments, and the like, the term "X including A" or the like for the material, composition, or the like does not exclude the one including an element other than A unless otherwise specified and unless otherwise apparent from the context. For example, for the component, the term is used to embrace "X including A as a main component", and the like. For example, it is naturally understood that the term "silicon member" or the like herein used is not limited to pure silicon but also embraces a SiGe (silicon germanium) alloy, other multinary alloys containing silicon as a main component, and a member containing other additives, and the like. Whereas, gold plating, a Cu layer, nickel plating, or the like, herein used is assumed to embrace not only the pure one but also a member containing gold, Cu, nickel, or the like as a main component, unless otherwise specified.

Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

Further, in the present application, the term "planar surface" or "side surface" is used. With the semiconductor element-formed surface of the semiconductor chip as the reference surface, the surface in parallel with the reference surface is described as a planar surface. Whereas, the surface crossing with the planar surface is described as a side surface. Further, the direction in which two spaced planar surfaces are connected in a side view is described as a thickness direction.

Whereas, in the present invention, the term "top surface" or "lower surface" may be used. However, the mounting forms of a semiconductor package include various forms. Accordingly, after mounting of a semiconductor package, for example, the top surface may be arranged below the lower surface. In the present application, the planar surface on the element-formed surface side of the semiconductor chip, or the planar surface on the chip-mounted side of the lead frame is described as a top surface, and the surface situated opposite to the top surface is described as a lower surface.

Further, in respective drawings of embodiments, the same or similar portions are indicated with the same or similar reference numerals and signs, and will not be repeatedly described in principle.

Further, in the accompanying drawings, hatching or the like may be omitted even in cross section when it rather complicates the drawing, or when it is apparently distinct from the gap. In conjunction with this, when apparent from the description or the like, or in other cases, even for a two-dimensionally closed hole, the background outline may be omitted. Further, even not in cross section, hatching or a dot pattern may be added in order to clearly demonstrate that the part is not a gap, or in order to clearly demonstrate the boundary between regions.

Embodiments

The technology described in the following embodiments is widely applicable to a semiconductor device in which a plurality of leads protrude from a sealing body for sealing a semiconductor chip. In the present embodiment, as one example, a description will be given to an embodiment of a QFP (Quad Flat Package) type semiconductor device to which the technology is applied, and in which leads protrude from each of the four sides included in a sealing body formed in a tetragonal shape in a plan view.

<Semiconductor Device>

Figure 2:
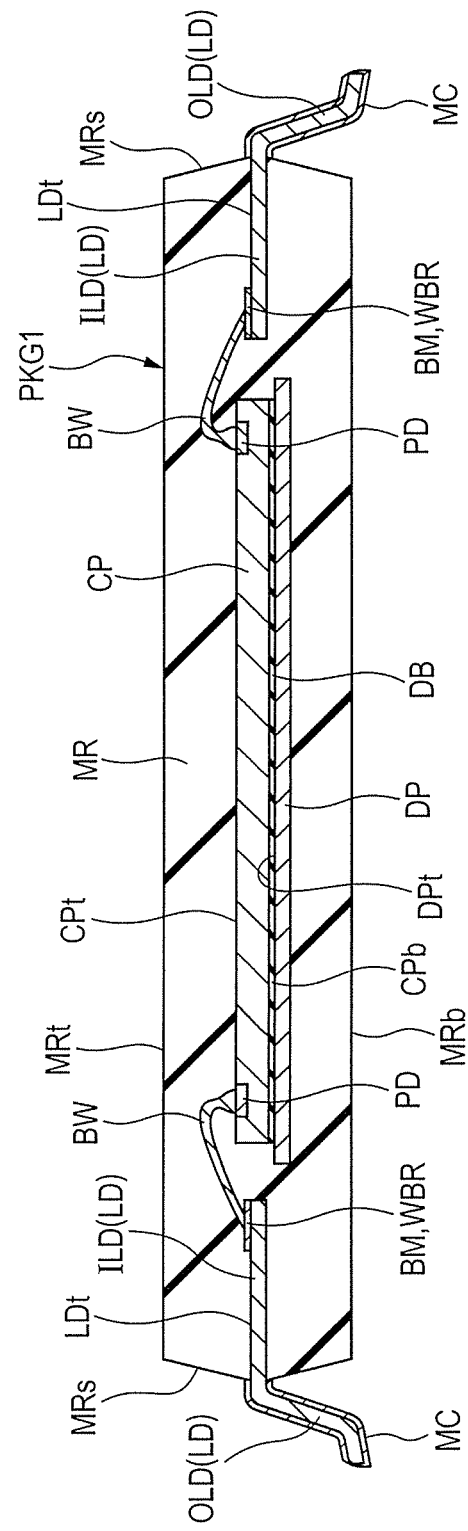
FIG. 2 is a cross sectional view along line A-A of FIG. 1.
Figure 3:
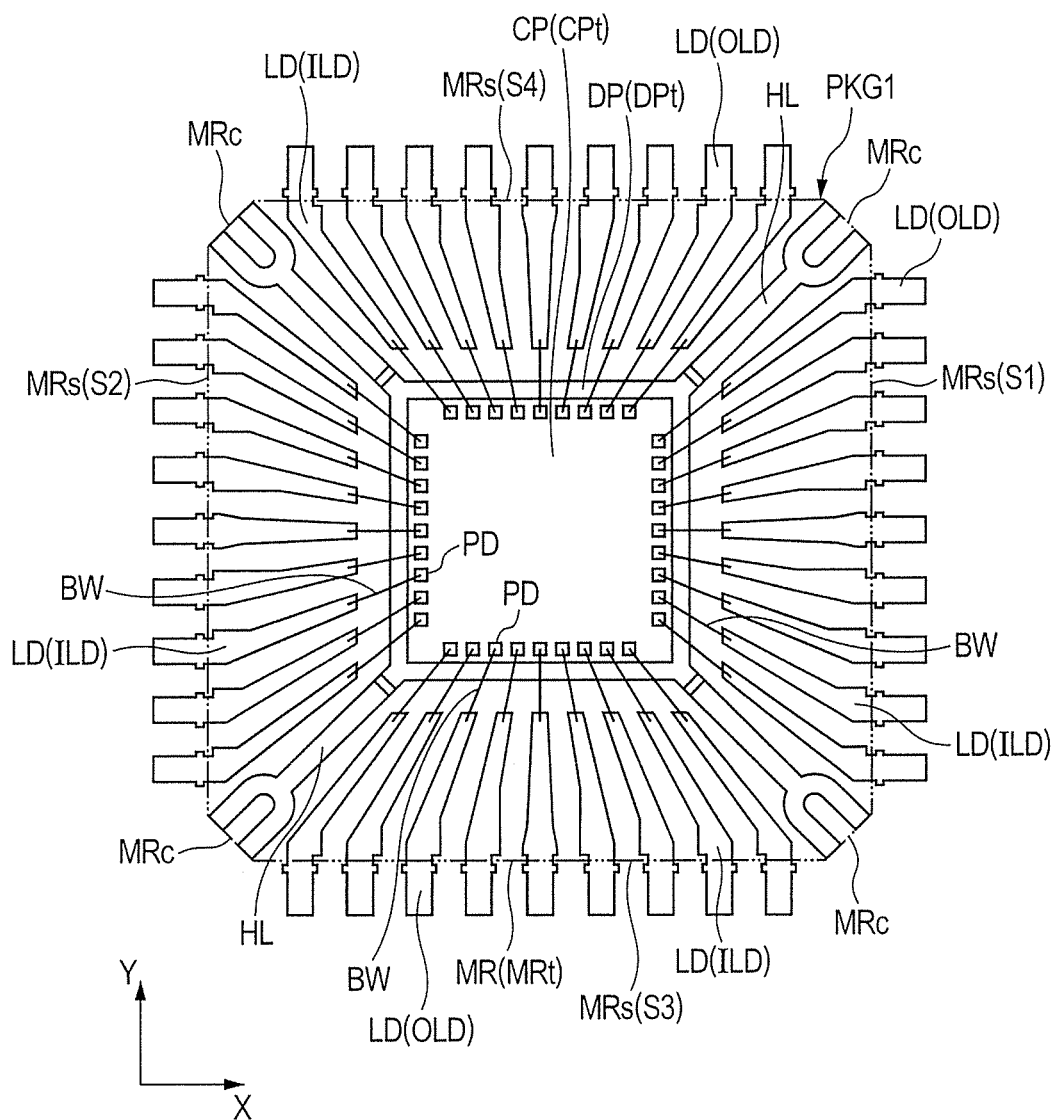
FIG. 3 is a perspective plan view showing an internal structure of the semiconductor device as seen through a sealing body shown in FIG. 1.

First, the outline of the configuration of a semiconductor device PKG1 of the present embodiment will be described by reference to FIGS. 1 to 4. FIG. 1 is a top view of the semiconductor device of the present embodiment. Whereas, FIG. 2 is a cross sectional view along line A-A of FIG. 1. Further, FIG. 3 is a perspective plan view showing an internal structure of the semiconductor device as seen through a sealing body shown in FIG. 1. Furthermore, FIG.

4 is an enlarged cross sectional view showing a state in which the semiconductor device shown in FIG. 2 is mounted over a mounting substrate.

As shown in FIGS. 1 to 3, the semiconductor device PKG1 has a semiconductor chip CP (see FIGS. 2 and 3), a plurality of leads LD which are external terminals arranged around the semiconductor chip CP, and a plurality of wires BW of conductive members for electrically coupling the semiconductor chip CP and the plurality of leads LD (see FIGS. 2 and 3). Further, the semiconductor chip CP and the plurality of wires BW are sealed by a sealing body (resin body) MR. Furthermore, the inner lead part ILD (see FIGS. 2 and 3) of each of the plurality of leads LD is sealed by the sealing body MR, and the outer lead part OLD of each of the plurality of leads LD is exposed from the sealing body MR.

As shown in FIG. 1, the plan configuration of the sealing body MR included in the semiconductor device PKG1 is formed in a tetragonal shape. The sealing body MR has an upper surface MRt, and a lower surface (back surface or to-be-mounted surface) MRb (see FIG. 2) opposite to the upper surface MRt, and a plurality of (four) side surfaces MRs situated between the upper surface MRt and the lower surface MRb.

The sealing body MR includes, in a plan view, a side (main side) S1 extending in the X direction, a side (main side) S2 situated opposite to the side S1, a side (main side) S3 extending along the Y direction crossing with (orthogonal to) the X direction, and a side (main side) S4 situated opposite to the side S3. Then, the four side surfaces MRs included in the sealing body MR are arranged along respective sides of the sealing body MR. Further, in the example shown in FIG. 1, the corner parts MRc at which respective sides of the sealing body MR cross with each other are chamfered.

Herein, the corner part MRc of the sealing body MR includes the peripheral region of the corner of the point of intersection between given two sides (two main sides) crossing with each other of the four sides (four main sides) of the sealing body MR. Incidentally, strictly, as shown in FIGS. 1 and 3, each corner part MRc of the sealing body MR is chamfered (tapered in the example shown in FIG. 1, but may also be R processed). Accordingly, each point of intersection between the main sides is arranged outside each corner part MRc of the sealing body MR. However, the chamfered part is sufficiently smaller than the length of the main side. For this reason, in the present application, a description will be given by regarding the center of the chamfered part as the corner of the sealing body MR.

Further, in the case of the semiconductor device PKG1 in which a plurality of leads LD are provided at each of the four sides of the sealing body MR in a tetragonal shape in plan configuration as in the present embodiment, the range of the corner part MRc can be defined as follows. Namely, as shown in FIG. 1, in the semiconductor device PKG1, a plurality of leads LD are arrayed along each of the side S1, the side S2, the side S3, and the side S4. The corner part MRc is defined as a region between the leads LD provided at the outermost parts of the arrays of the leads LD along respective sides of the plurality of leads LD. Below, in the present application, the description as the corner part MRc of the sealing body MR is used as the same meaning or contents as described above unless specified as being used as a particularly different meaning or contents.

Further, in the semiconductor device PKG1, a plurality of leads LD are arranged along each side (each main side) of the sealing body MR formed in a tetragonal shape in plan configuration. The plurality of leads LD are each formed of a metal material, and, is a metal member containing, for example, copper (Cu) as a main component in the present embodiment.

Figure 4:
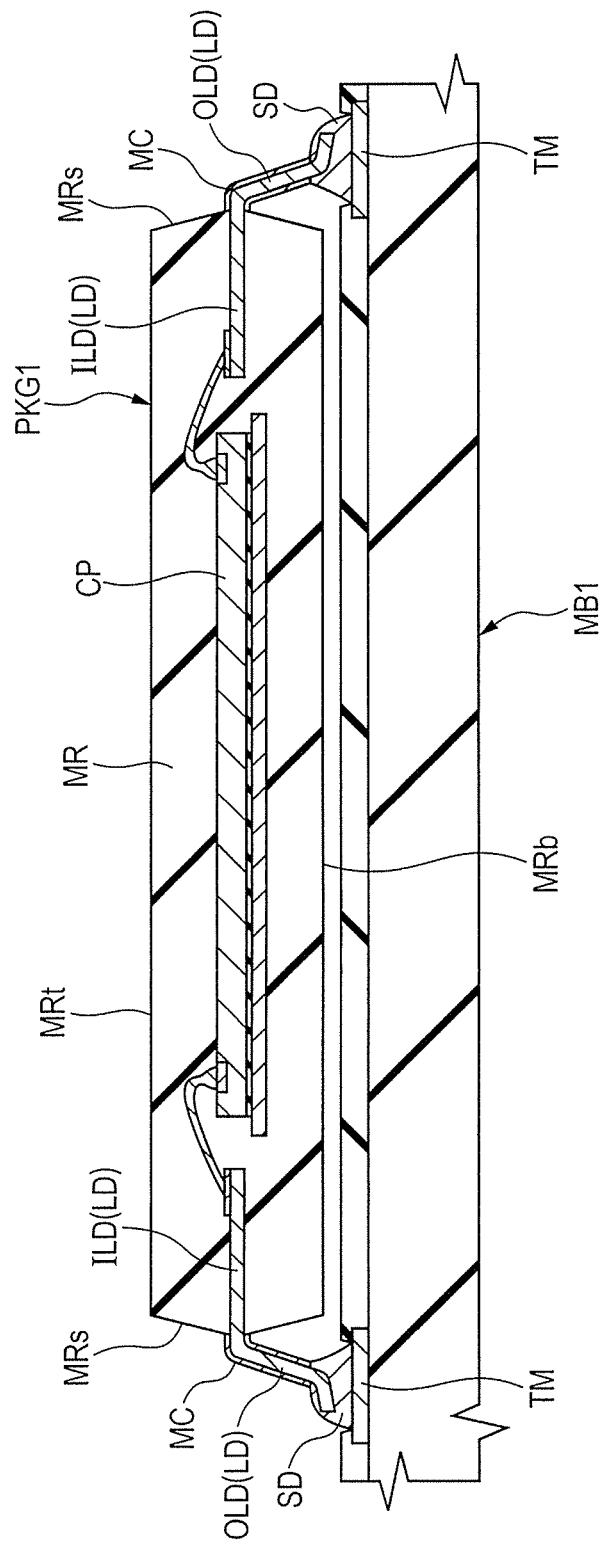
FIG. 4 is an enlarged cross sectional view showing a state in which the semiconductor device shown in FIG. 2 is mounted over a mounting substrate.

The outer lead parts OLD of the plurality of leads LD protrude toward outside the sealing body MR at each side surface MRs of the sealing body MR. Whereas, a metal film (outer plating film) MC is formed at the exposed surface of each outer lead part OLD of the plurality of leads LD, for example, at the surface of the base material including copper as a main component. The metal film MC is formed of a metal material having better wettability to solder than to copper of the base material, such as solder, and is a metal film covering the surface of the copper member of the base material. The metal film MC formed of solder, or the like is formed at each of the outer lead parts OLD of the plurality of leads LD which are external terminals of the semiconductor device PKG1. As a result, when the semiconductor device PKG1 is mounted over a mounting substrate MB1 as shown in FIG. 4, the wettability of a solder material SD which is a conductive coupling material can be improved. This results in an increase in junction area between the plurality of leads LD and the solder material SD. Accordingly, it is possible to improve the junction strength between the plurality of leads LD and the terminals TM on the mounting substrate MB1 side.

Incidentally, in the example shown in FIG. 2, an example is shown in which the metal film MC of the solder film is formed at the exposed surface of the outer lead part OLD of each lead LD by a plating method. However, the metal films MC include various modified examples. For example, the metal film MC may be a lamination film of a metal film including nickel (Ni) as a main component, and a metal film including palladium (Pd) as a main component. Alternatively, for example, a metal film including gold (Au) as a main component may be further stacked over the surface of a metal film including palladium as a main component. Alternatively, when the metal film MC is formed of a material other than solder, the metal film MC may be formed in such a manner as to cover the surfaces of each inner lead part ILD and each outer lead part OLD of the plurality of leads LD.

Further, as shown in FIGS. 2 and 3, a semiconductor chip CP is sealed in the inside of the sealing body MR. As shown in FIG. 3, the semiconductor chip CP is formed in a tetragonal shape in a plan view. At the surface CPt, a plurality of pads (bonding pads) PD are provided along each of the four sides forming the outer edge of the surface CPt. Further, the semiconductor chip CP (particularly, the semiconductor substrate) is formed of, for example, silicon (Si). Although not shown, at the main surface of the semiconductor chip CP (particularly, the semiconductor element formation region provided at the upper surface of the semiconductor substrate of the semiconductor chip CP), a plurality of semiconductor elements (circuit elements) are formed. Then, the plurality of pads PD are electrically coupled with the semiconductor elements via wires (not shown) formed at the wiring layer arranged in the inside of the semiconductor chip CP (particularly, between the surface CPt and the semiconductor element formation region not shown), respectively. In other words, the plurality of pads PD are electrically coupled with the circuit formed at the semiconductor chip CP.

Further, at the surface CPt of the semiconductor chip CP, an insulation film covering the substrate and the wires of the semiconductor chip CP is formed. Respective surfaces of the plurality of pads PD are exposed at openings formed in the insulation film from the insulation film, respectively. Further, the pad PD is formed of a metal, and in the present embodiment, is formed of, for example, aluminum (Al).

Further, around the semiconductor chip CP (i.e., around the die pad DP), for example, a plurality of leads LD are arranged. Then, the plurality of pads (bonding pads) PD exposed at the surface CPt of the semiconductor chip CP are electrically coupled with the inner lead parts ILD of the plurality of leads LD situated inside the sealing body MR via a plurality of wires (conductive members) BW, respectively. The wire BW is formed of, for example, gold (Au) or copper (Cu). A part (e.g., one end) of the wire BW is bonded to the pad PD, and the other part (e.g., the other end) thereof is bonded to the bonding part WBR of the inner lead part ILD (see FIG. 2). Incidentally, at the surface of the bonding part WBR of the inner lead part ILD, a metal film (a plating film or a plating metal film) BM (see FIG. 2) is formed. The metal film BM is formed of, for example, a material including silver (Ag), gold, or palladium as a main component (e.g., a lamination structure in which a thin gold film is formed over a palladium film). At the surface of the bonding part WBR of the inner lead part ILD, the metal film BM formed of a material including silver, gold, or palladium as a main component is formed. This can improve the bonding strength with wire BW formed of gold.

Further, the semiconductor chip CP is mounted at the die pad DP which is a chip mounting part. In the example shown in FIG. 3, the upper surface (chip mounting surface) DPt of the die pad DP is formed in a tetragonal shape having a plane area larger than the surface area of the semiconductor chip CP. However, the die pad DP is a support member for supporting the semiconductor chip CP. Other than the example shown in FIG. 3, various modified examples are applicable to the configuration and the size thereof. For example, the plan configuration of the die pad DP may be formed in a circular shape. Alternatively, for example, the plane area of the die pad DP may be set smaller than the surface CPt of the semiconductor chip CP.

Further, as shown in FIG. 3, around the die pad DP, a plurality of suspending leads HL are arranged. The suspending lead HL is a member for supporting the die pad DP at the support part (frame part) of the lead frame in the manufacturing steps of the semiconductor device PKG1. In the example shown in FIG. 3, four suspending leads HL are arranged from the corner parts of the die pad DP toward the corner parts MRc of the sealing body MR, respectively. Particularly, each one end of the plurality of suspending leads HL is coupled to the corner part (corner) of the die pad DP. Whereas, the other end of each of the plurality of suspending leads HL extends toward the corner part MRc of the sealing body MR, and is bifurcated in the vicinity of the corner part MRc, and is exposed from the sealing body MR at the side surface MRs of the sealing body MR. The suspending leads HL are allowed to extend toward the corner parts MRc of the sealing body MR, respectively. As a result, the array of the plurality of leads LD arranged along each side (each main side) of the sealing body MR becomes less likely to be hindered by the suspending leads HL.

Whereas, in the present embodiment, the upper surface DPt of the die pad DP, and the upper surface of the inner lead part ILD of the lead LD are arranged at different heights. In the example shown in FIG. 2, the upper surface DPt of the die pad DP is arranged at a lower position than the position of the upper surface LDt of the inner lead part ILD. For this reason, the plurality of suspending leads HL shown in FIG. 3 are each provided with an offset part (a down set part in the example of the present embodiment) bent so that the upper surface DPt of the die pad DP is situated at a height different from the height of the upper surface LDt of the inner lead part ILD of the lead LD (see FIG. 2).

Whereas, the semiconductor chip CP is mounted at the center of the die pad DP. As shown in FIG. 2, the semiconductor chip CP is mounted over the die pad DP with the back surface CPb facing the upper surface DPt of the die pad DP via a die bonding material (adhesive material) DB. In other words, mounting is achieved by a so-called face up mounting method in which the opposite surface (back surface CPb) to the surface (main surface) CPt at which the plurality of pads PD are formed is allowed to face the chip mounting surface (upper surface DPt). The die bonding material DB is an adhesive material for die bonding the semiconductor chip CP. For example, a resin adhesive obtained by allowing an epoxy type thermosetting resin to contain metal particles formed of silver, or the like, or a metal bonding material such as a solder material is used.

<Manufacturing Method of Semiconductor Device>

Figure 5:
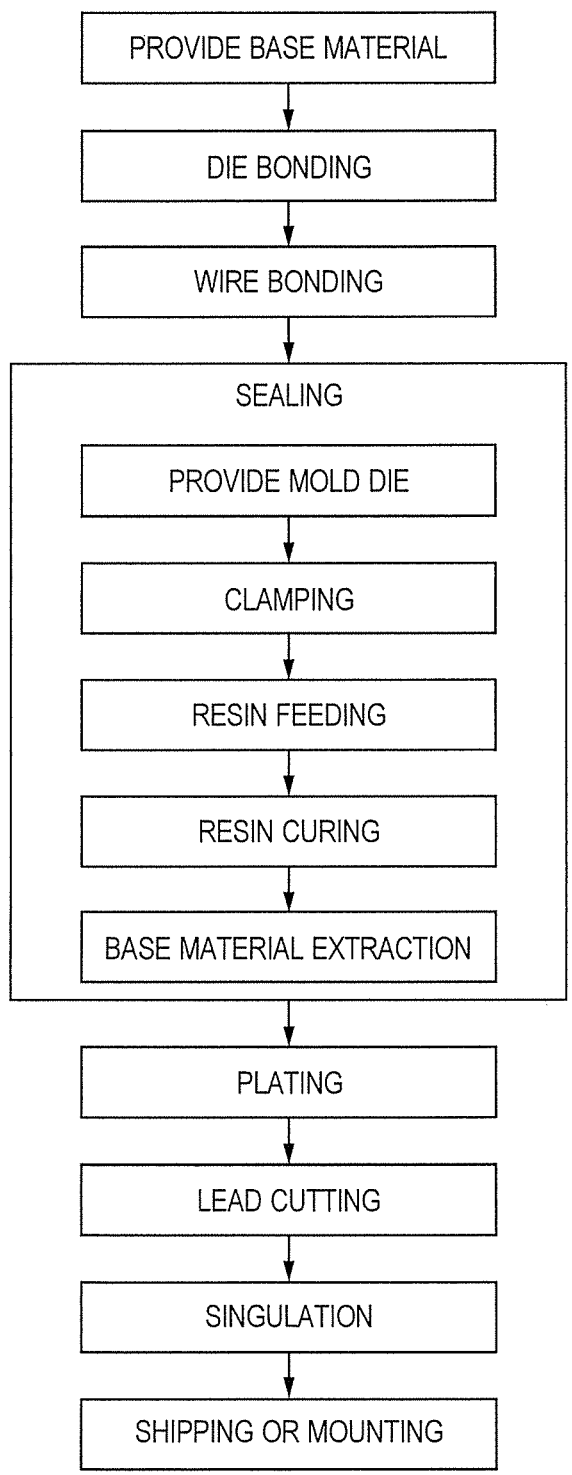
FIG. 5 is an explanatory view showing a flow of the assembly steps of the semiconductor device described by reference to FIGS. 1 to 4.

Then, a manufacturing method of the semiconductor device PKG1 described by reference to FIGS. 1 to 4 will be described by reference to the flowchart shown in FIG. 5. FIG. 5 is an explanatory view showing the flow of the assembly steps of the semiconductor device described by reference to FIGS. 1 to 4.

Further, FIG. 5 shows the main steps of the manufacturing steps of the semiconductor device PKG1. Other than the assembly flow shown in FIG. 5, various modified examples are applicable. For example, although the marking step in which a product identification mark is formed at the sealing body MR is not shown in FIG. 5, this can also be added to between the sealing step and the plating step. Further, for example, in FIG. 5, although an inspection step is not shown, an inspection step may be added to, for example, after the singulation step.

<Base Material Provision Step>

Figure 6:
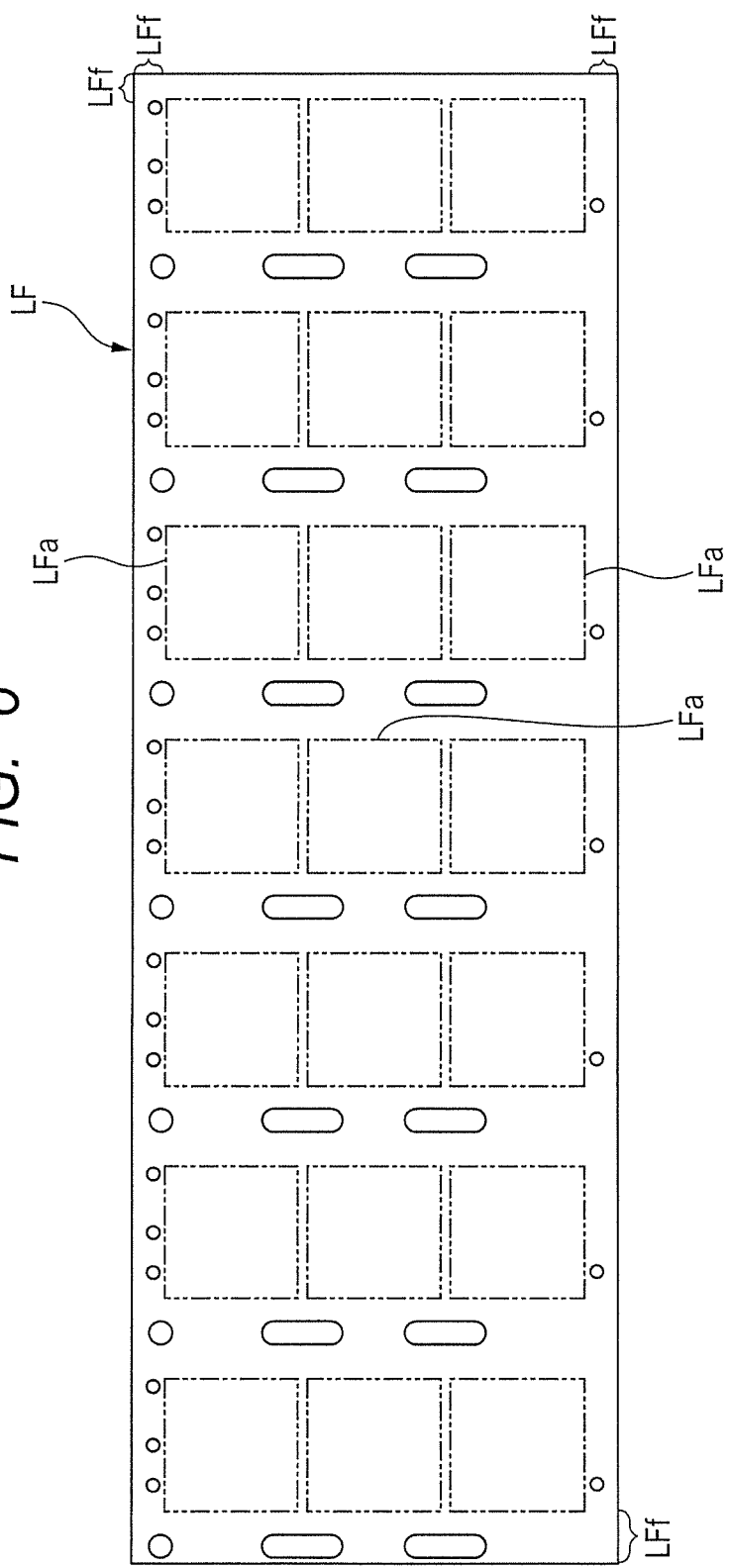
FIG. 6 is a plan view showing a lead frame provided in the base material provision step described in FIG. 5.

In the base material provision step shown in FIG. 5, the lead frame LF shown in FIG. 6 is provided. FIG. 6 is a plan view showing the lead frame provided in the base material provision step shown in FIG. 5. Further, FIG. 7 is an enlarged plan view showing one of the device regions shown in FIG. 6.

As shown in FIG. 6, the lead frame LF provided in the present step includes a plurality of device regions LFa inside the frame part LFf. The lead frame LF is formed of a metal, and, in the present embodiment, is formed of a metal including, for example, copper (Cu) as a main component.

Incidentally, in the present embodiment, a description will be given by taking an example in which as shown in FIG. 5, a plating step is performed after a sealing step, and the metal film MC shown in FIG. 2 is formed at the outer lead part OLD. However, as a modified example, at the stage of the base material provision step, the surface of the base material including copper as a main component may be previously covered with the metal film MC. In this case, the entire exposed surface of the lead frame LF is covered with the metal film MC.

Figure 7:
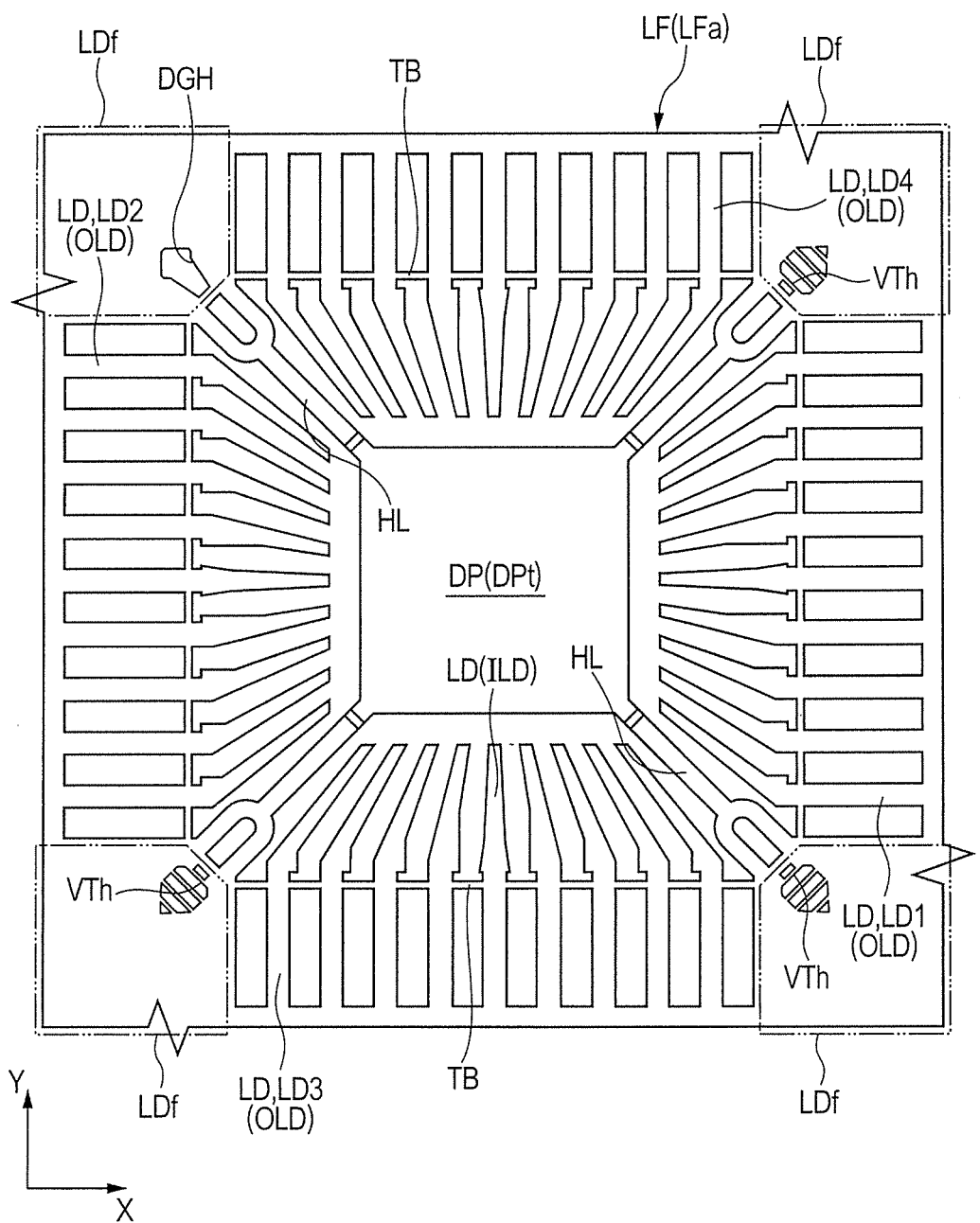
FIG. 7 is an enlarged plan view showing one of the device regions shown in FIG. 6.

Further, as shown in FIG. 7, at the central part of each device region LFa, a die pad DP which is a chip mounting part is formed. To the die pad DP, a plurality of suspending leads HL are coupled, and are arranged in such a manner as to extend toward the corner parts of the device region LFa. The die pad DP is supported by the frame part LFf of the lead frame LF via the suspending leads HL.

Further, around the die pad DP, a plurality of leads LD are formed between the plurality of suspending leads HL, respectively. The plurality of leads LD are respectively coupled with the frame part LFf. In the example of the present embodiment, the plurality of leads LD are provided around the die pad DP, and are formed in such a manner as to extend in all directions. In other words, the plurality of leads LD include a plurality of leads LD1 and a plurality of leads LD2 extending in the X direction, and a plurality of leads LD3 and a plurality of LD4 extending in the Y direction crossing with the X direction. Further, the plurality of leads LD1 and the plurality of leads LD2 are provided at mutually opposite positions across the die pad DP. Whereas, the plurality of leads LD3 and the plurality of leads LD4 are provided at mutually opposite positions across the die pad DP.

Further, the plurality of leads LD are connected with each other via tie bars TB, respectively. The tie bar TB has a function as a dam member for suppressing leakage of a resin in the sealing step shown in FIG. 5, other than the function as a connecting member of connecting the plurality of leads LD.

The tie bars TB are provided in such a manner as to surround the periphery of the die pad DP. Further, the semiconductor device of the present embodiment is, as described above, a QFP type semiconductor device. Accordingly, a plurality of outer lead parts OLD protrude toward outside the tie bars TB, respectively, with respect to the die pad DP. In the example shown in FIG. 7, four lead groups with their respective outer lead parts OLD protruding in all directions with the die pad DP as the center are provided. Then, frame parts LFf for supporting the die pad DP and the plurality of leads LD are provided on the opposite sides of each lead group.

Although described particularly later, at one site of the frame parts LFf provided around the device formation region LFa shown in FIG. 7, a degate hole (through hole or opening) DGH is formed at a position overlapping the gate part serving as a resin feed port in the sealing step shown in FIG. 5. Further, of the four frame parts LFf shown in FIG. 7, in each of three frame parts LFf other than the frame part LFf including the degate hole DGH formed therein, a plurality of through holes VTh are provided at a position overlapping the vent part serving as an outlet port for the gas in the cavity in the sealing step shown in FIG. 5.

<Die Bonding Step>

Figure 8:
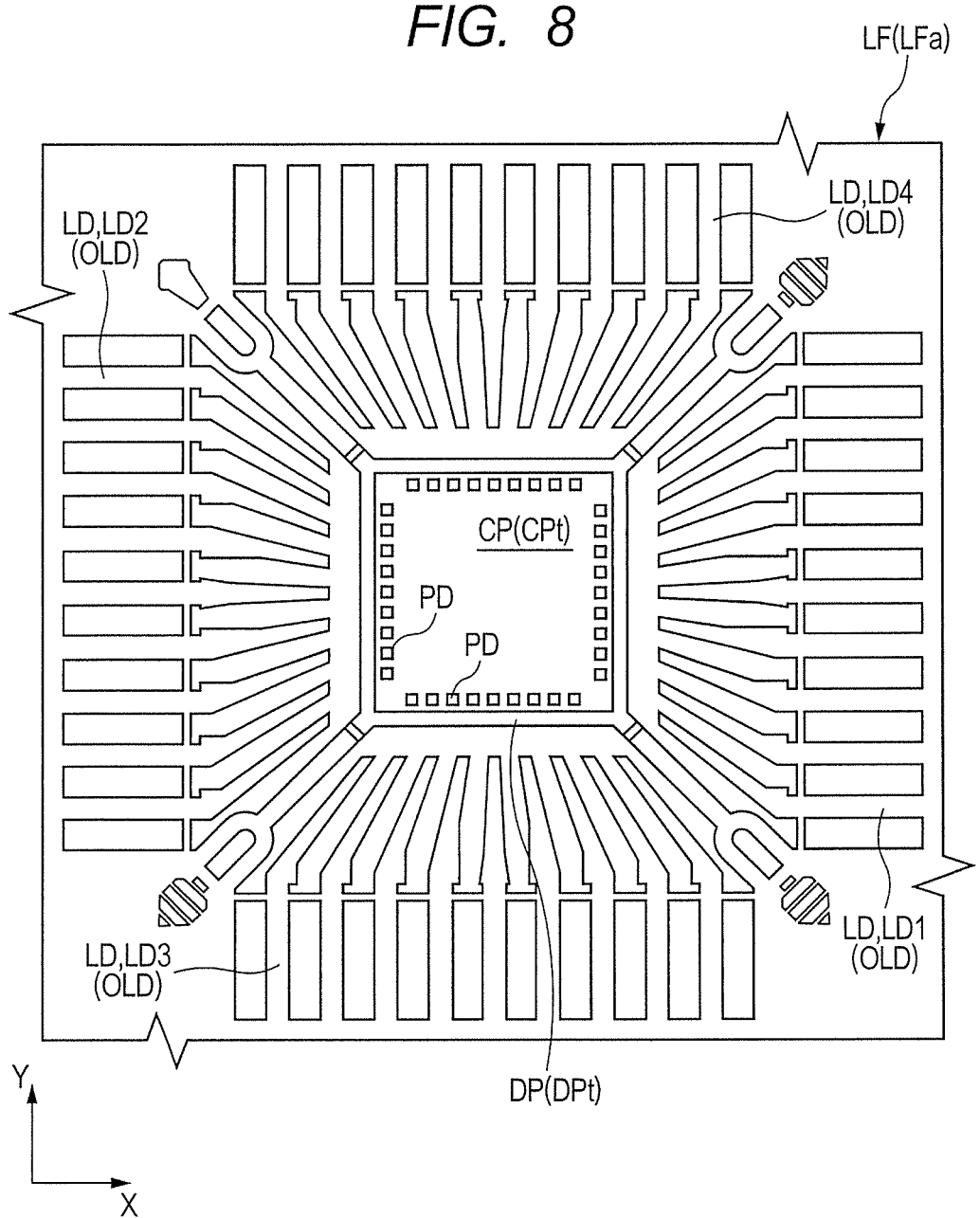
FIG. 8 is an enlarged plan view showing a state in which a semiconductor chip is mounted over a die pad of the lead frame shown in FIG. 7.

Then, in the die bonding step (semiconductor chip mounting step) shown in FIG. 5, as shown in FIG. 8, the semiconductor chip CP is mounted over the die pad DP. FIG. 8 is an enlarged plan view showing a state in which the semiconductor chip is mounted over the die pad of the lead frame shown in FIG. 7.

As described by reference to FIG. 2, the semiconductor chip CP has the surface CPt including the plurality of pads PD formed thereover, and a back surface CPb situated opposite to surface CPt (see FIG. 2). In the present step, the semiconductor chip CP and the die pad DP are bonded and fixed with each other via a die bonding material DB which is an adhesive material formed of a thermosetting resin such as epoxy resin (see FIG. 2). In the example shown in FIG. 8, in a plan view, the semiconductor chip CP is mounted so that a part of the upper surface DPt of the die pad DP is covered with the semiconductor chip CP.

Further, as described by reference to FIG. 2, in the example of the present embodiment, the semiconductor chip CP is mounted over the die pad DP by a so-called face up mounting method so that the back surface CPb faces the upper surface DPt which is the chip mounting surface of the die pad DP.

<Wire Bonding Step>

Figure 9:
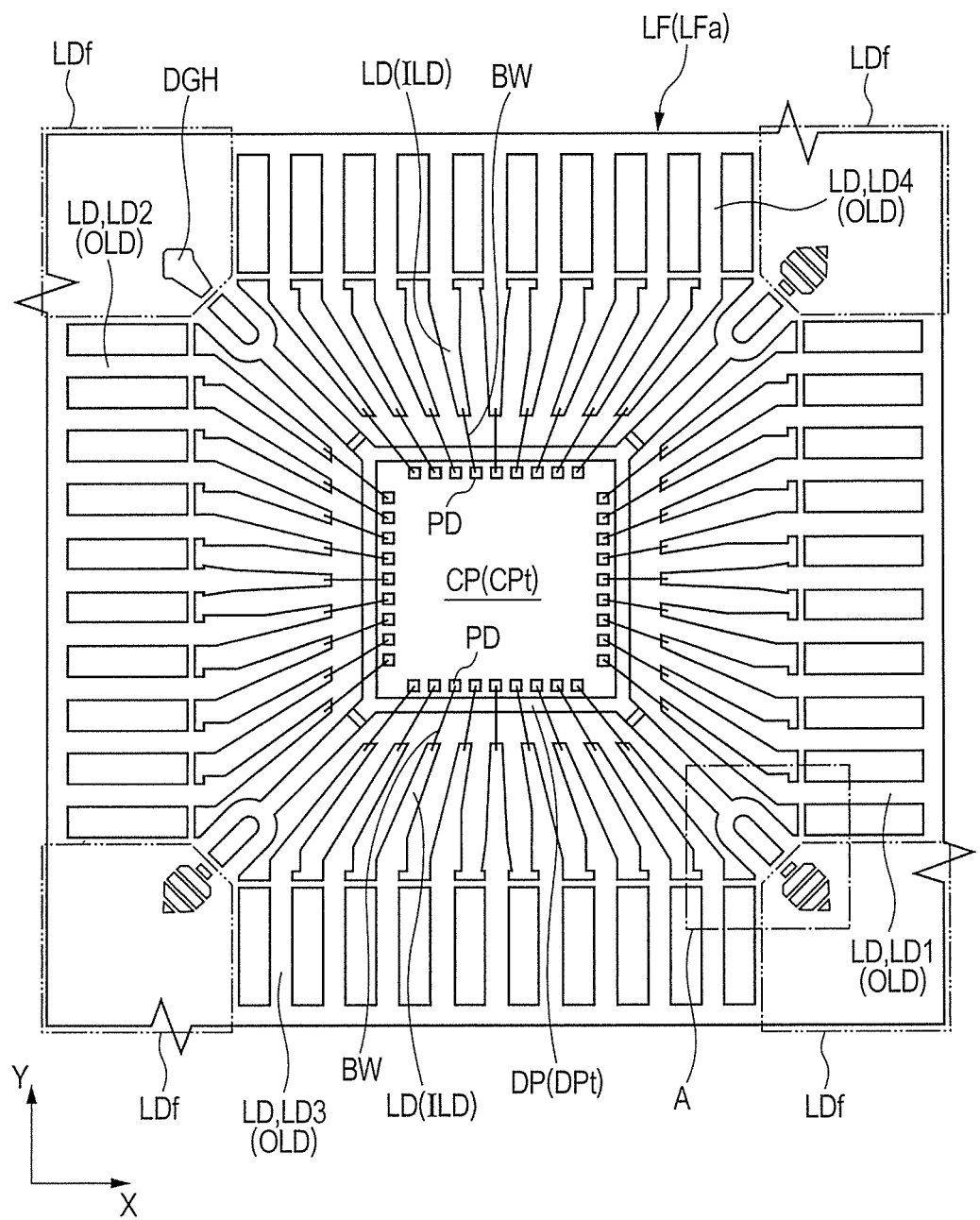
FIG. 9 is an enlarged plan view showing a state in which the semiconductor chip and a plurality of leads shown in FIG. 8 are electrically coupled with each other via wires, respectively.

Then, in the wire bonding step shown in FIG. 5, as shown in FIG. 9, the plurality of pads PD formed over the surface CPt of the semiconductor chip CP, and the plurality of leads LD arranged around the semiconductor chip CP are electrically coupled with each other via the plurality of wires (conductive members) BW, respectively. FIG. 9 is an enlarged plan view showing a state in which the semiconductor chip and the plurality of leads shown in FIG. 8 are electrically coupled with each other via wires, respectively.

In the present step, using a wire bonding tool not shown, one end of the wire BW formed of a metal material such as gold (Au) or copper (Cu) is bonded with the pad PD of the semiconductor chip CP, and the other end thereof is bonded with the inner lead part ILD of the lead LD. As the bonding method, for example, a method in which the junction part is applied with an ultrasonic wave to form a metallic bond, a thermocompression method, or a method using an ultrasonic wave and thermocompression in combination can be used.

<Sealing Step>

Figure 10:
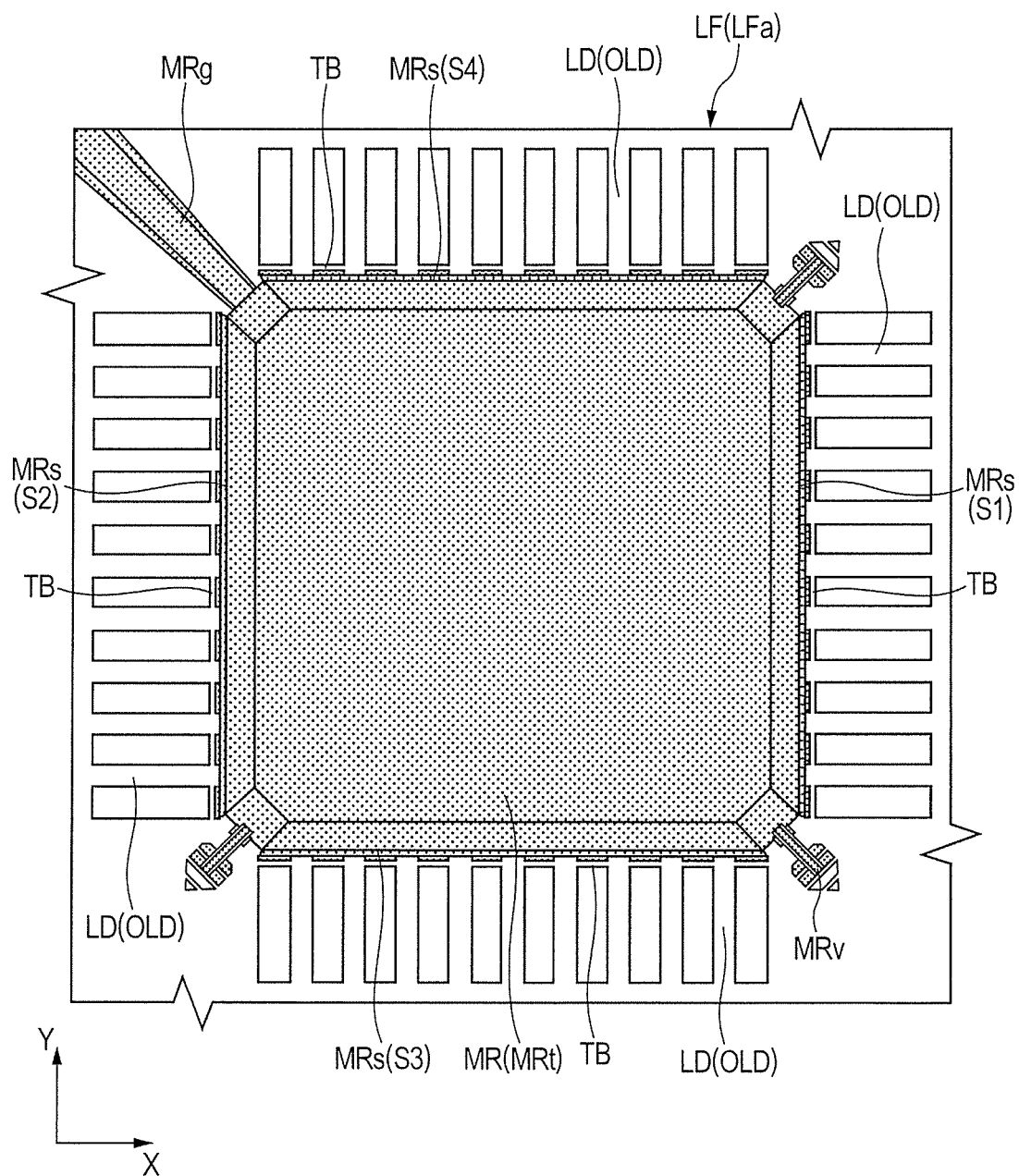
FIG. 10 shows an enlarged plan view showing a state in which a sealing body for sealing a semiconductor chip is formed in each of the plurality of device regions shown in FIG. 9.

Then, in the sealing step shown in FIG. 5, the semiconductor chip CP, the plurality of wires BW, and respective inner lead parts ILD of the plurality of leads LD shown in FIG. 9 are sealed with a resin, thereby to form a sealing body MR shown in FIG. 10. FIG. 10 is an enlarged plan view showing a state in which a sealing body for sealing a semiconductor chip is formed at each of the plurality of device regions shown in FIG. 9.

In the present step, with the lead frame LF arranged in the mold die including a plurality of cavities described later, a resin is fed into the space formed by the cavities. Then, the resin is cured, thereby to form the sealing body (sealing part) MR. Such a formation method of the sealing body MR is referred to as a transfer mold method.

In the example shown in FIG. 10, each cavity of the mold die is arranged in a region surrounded by the tie bars TB of each device region LFa in a plan view. For this reason, the main body portion of the sealing body MR is formed in the region surrounded by the tie bars TB of each device region LFa as shown in FIG. 10. Further, a part of the resin leaked from the cavities is dammed up by the tie bars TB. For this reason, respective outer lead parts OLD of the plurality of leads LD are exposed from the sealing body MR.

Of the plurality of leads LD, the outer lead parts OLD of the leads LD extending along the X direction protrude from the sealing body MR at the side S1 formed of the side surface MRs of the sealing body MR. Whereas, of the plurality of leads LD, the outer lead parts OLD of the leads LD extending along the X direction protrude from the sealing body MR at the side S2 formed of the side surface MRs of the sealing body MR. Further, of the plurality of leads LD, the outer lead parts OLD of the leads LD3 extending along the Y direction orthogonal to the X direction protrude from the sealing body MR at the side S3 formed of the side surface MRs of the sealing body MR. Furthermore, of the plurality of leads LD, the outer lead parts OLD of the leads LD4 extending along the Y direction protrude from the sealing body MR at the side S4 formed of the side surface MRs of the sealing body MR.

Further, FIG. 10 shows a gate resin MRg formed by the gate part serving as a feed port for the resin of the mold die for use in the sealing step. However, the gate resin MRg is removed after the present step, and before the next step (e.g., a plating step) is performed (gate break step). The removal step of the gate resin MRg is as follows: for example, a pin not shown is inserted into the degate hole (through hole or opening) DGH shown in FIG. 9, thereby to lift the gate resin MRg shown in FIG. 10; this results in rupture of the boundary between the gate resin MRg and the main body part of the sealing body MR. The details of the sealing step other than the foregoing will be described later.

<Plating Step>

Then, in the plating step shown in FIG. 5, a metal film MC (see FIG. 2) is formed at each exposed surface of the plurality of leads LD shown in FIG. 10 by a plating method. The metal film MC formed in the present step is formed in order to facilitate wetting on the leads LD of the solder material SD for electrically coupling the plurality of leads LD and the plurality of terminals TM on the mounting substrate side, respectively when the semiconductor device PKG1 is mounted over the mounting substrate MB1 as shown in FIG. 4.

In the present step, the metal film MC formed of solder is preferably formed at the exposed surface of the lead LD. Further, to the formation method of the metal film MC, an electroplating method is applicable in which ionized metal ions are precipitated at the exposed surface of the lead LD. The electroplating method is preferable in that control of the current at the time of formation of the metal film MC can readily control the film quality of the metal film MC. Further, the electrolytic plating method is preferable in that the formation time of the metal film MC can be shortened.

<Lead Cut Step>

Figure 11:
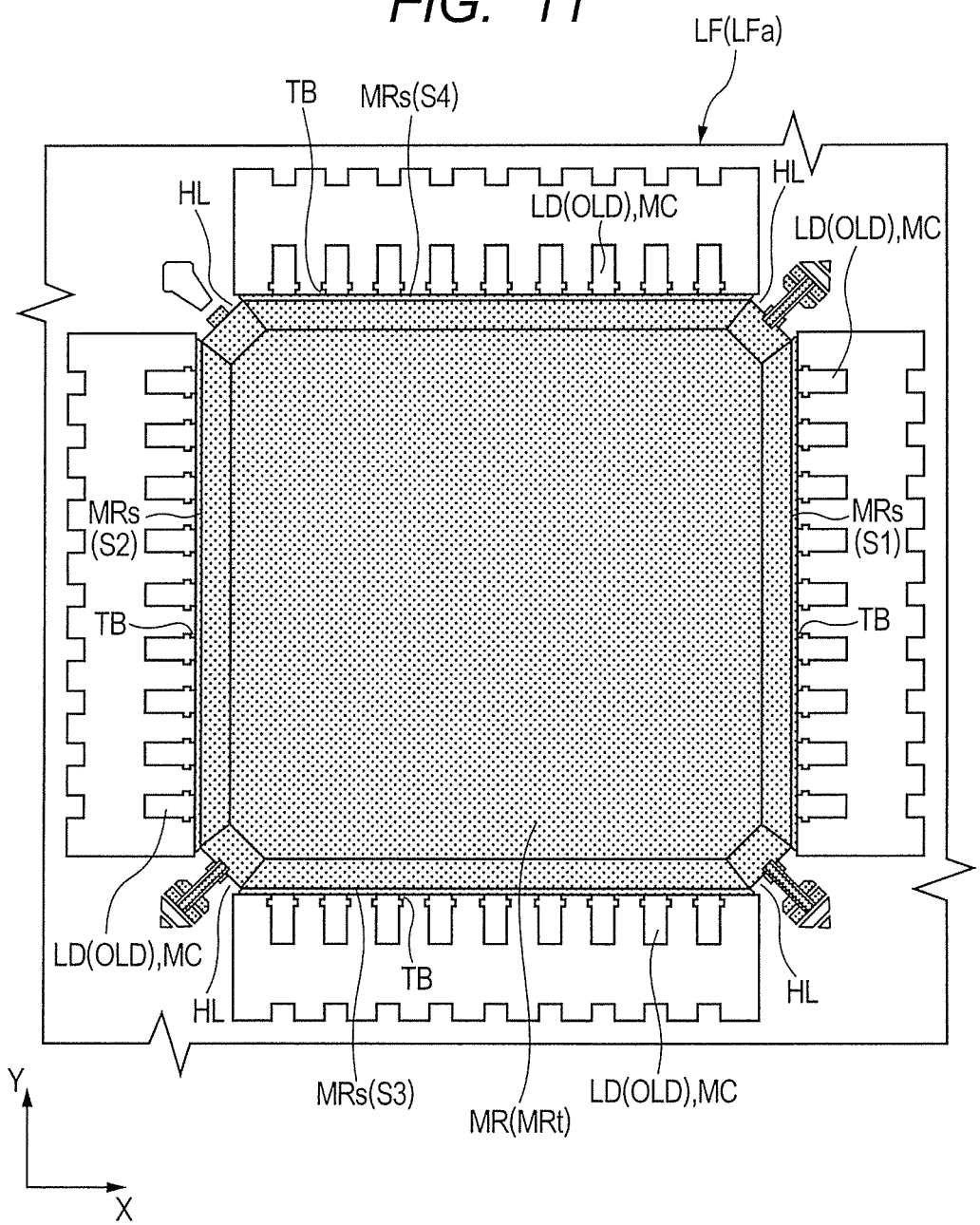
FIG. 11 is an enlarged plan view showing a state in which a metal film is formed at the exposed surfaces of the plurality of leads shown in FIG. 10, and respectively cut, followed by forming.

Then, in the lead cut step shown in FIG. 5, as shown in FIG. 11, respective outer lead parts OLD of the plurality of leads LD are cut, and the plurality of leads LD are cut apart from the lead frame LF, respectively. Further, in the present embodiment, after cutting the leads LD, the plurality of leads LD are formed, and are subjected to bending as shown in FIG. 2. FIG. 11 is an enlarged plan view showing a state in which a metal film is formed at each exposed surface of the plurality of leads shown in FIG. 10, and are respectively cut, followed by forming.

In the present step, the tie bars TB respectively connecting the plurality of leads LD are cut. Further, the plurality of leads LD are respectively cut apart from the frame part LFf (see FIG. 6). As a result, the plurality of leads LD become mutually separated members (independent members), respectively. Further, after the plurality of leads LD are cut apart, the sealing body MR and the plurality of leads LD are supported by the frame part LFf via the suspending leads HL.

Incidentally, in the present embodiment, a description has been given to cutting of the tie bars TB after the plating step. However, the following procedure is also acceptable: only the tie bars TB are first cut, then, the plating step is performed; further, the plurality of leads LD are respectively cut apart from the frame part LFf. As a result, the metal film MC can also be formed at each cut surface of the tie bars TB. This can suppress the discoloration of each cut surface of the tie bars TB due to oxidation. Further, before the lead LD is cut apart from the frame part LFf, the plating step is performed. For this reason, the deformation of the lead LD due to the plating solution can also be suppressed.

The plurality of leads LD and the tie bars TB are cut by press working using a cutting die described later. Further, the plurality of leads LD after cutting can be formed, for example, as shown in FIG. 2 by subjecting the outer lead parts OLD of the plurality of leads LD to bending using press working using, for example, a forming die not shown.

<Singulation Step>

Figure 12:
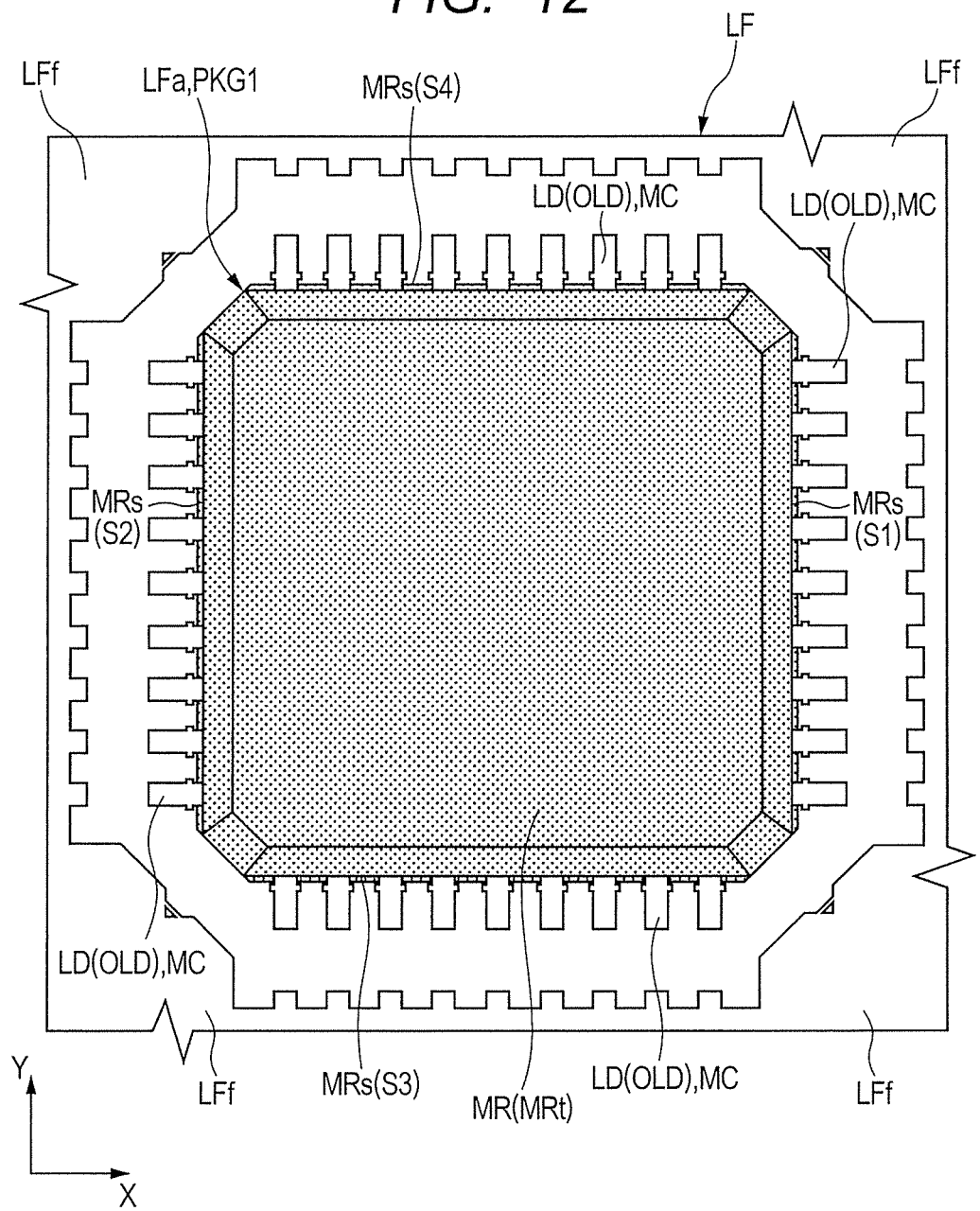
FIG. 12 is an enlarged plan view showing a state in which the suspending leads shown in FIG. 11 have been cut for singulation into respective device regions.

Then, in the singulation step shown in FIG. 5, as shown in FIG. 12, the plurality of suspending leads HL are respectively cut, thereby to separate the semiconductor package in each of the plurality of device regions LFa. FIG. 12 is an enlarged plan view showing a state in which the suspending leads shown in FIG. 11 have been cut for singulation into respective device regions.

In the present step, the plurality of suspending leads HL, and the resin left at the corner parts of the sealing body MR are cut, thereby to obtain a semiconductor device PKG1 (particularly, a test piece before an inspection step) of the semiconductor package. With the cutting method, as with the lead formation step, cutting can be achieved by press working using a cutting die not shown.

After the present step, necessary inspections and tests such as visual inspection and electric tests are performed. Only accepted products become the semiconductor devices PKG1 of the finished products shown in FIGS. 1 to 4. Then, the semiconductor devices PKG1 are shipped, or are each mounted over the mounting substrate MB1 shown in FIG. 4.

<Details of Sealing Step>

Figure 13:
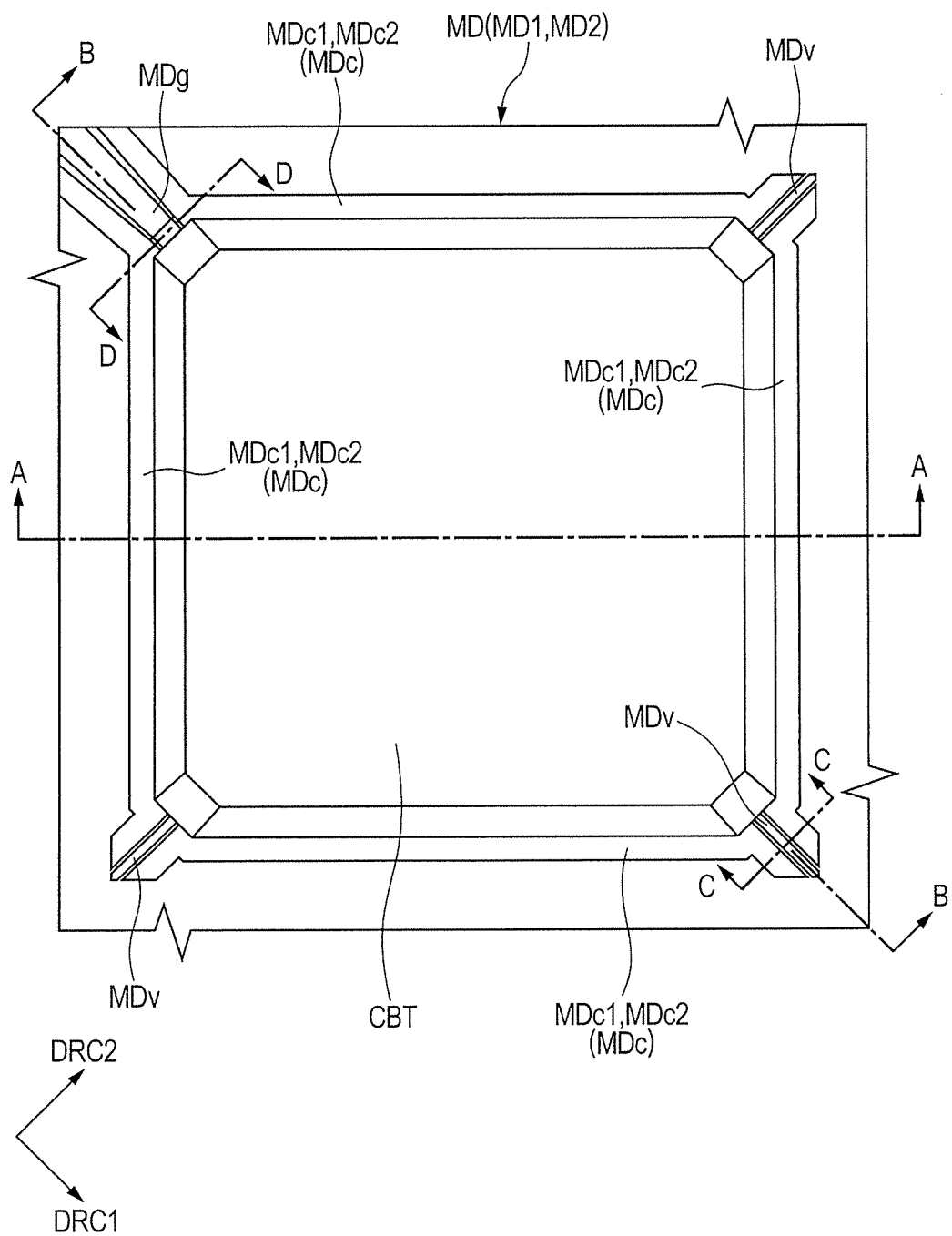
FIG. 13 is an enlarged plan view showing an example of the inner side surface (molded surface) of the mold die for use in the sealing step shown in FIG. 5.
Figure 14:
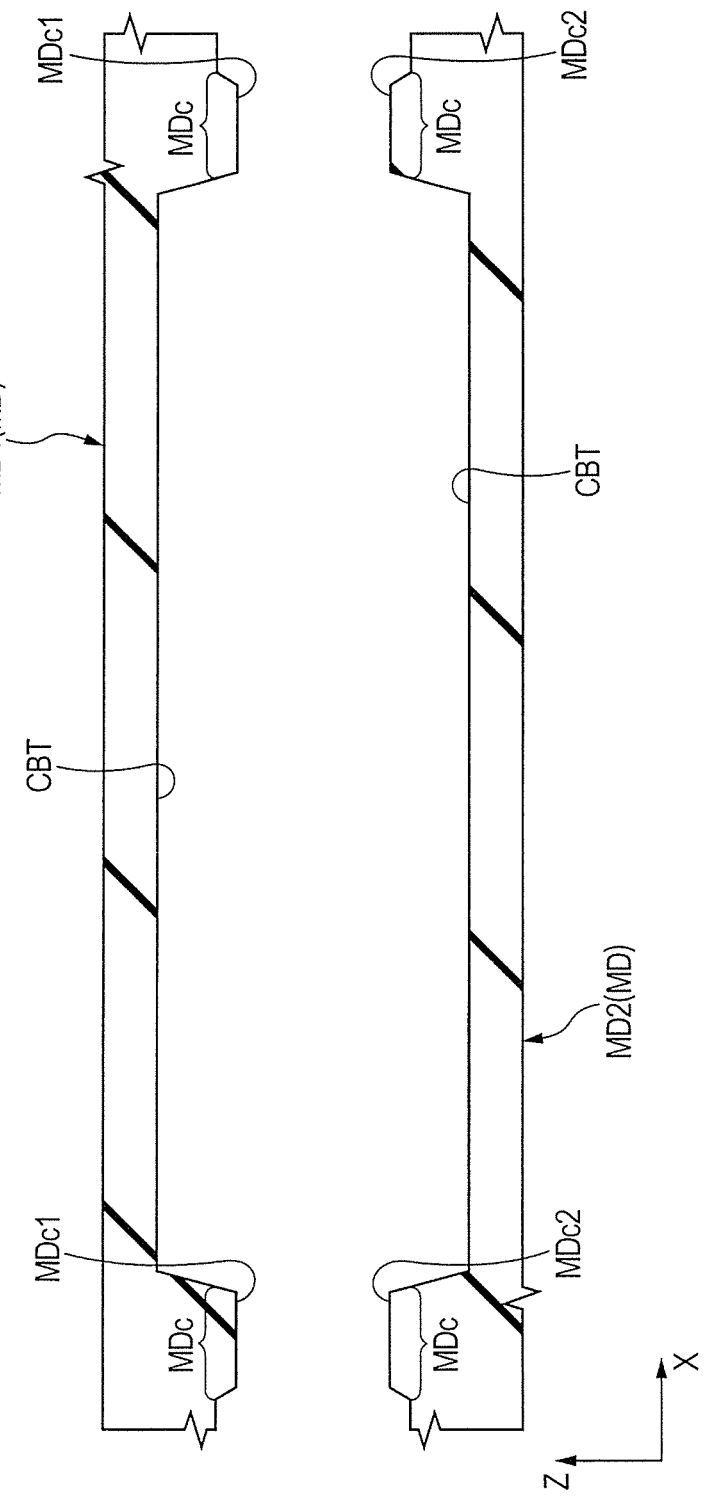
FIG. 14 is an enlarged cross sectional view along line A-A of FIG. 13.
Figure 15:
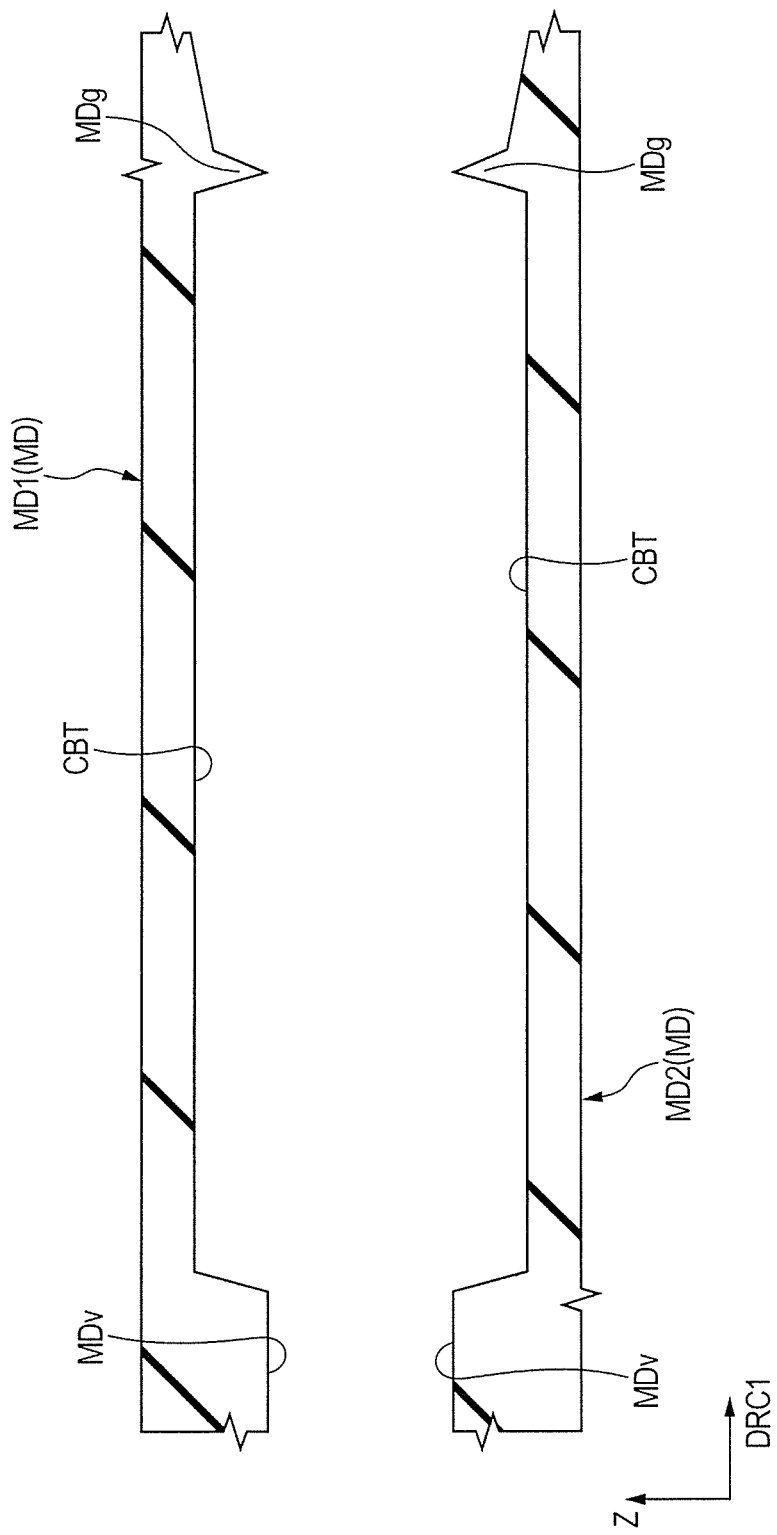
FIG. 15 is an enlarged cross sectional view along line B-B of FIG. 13.

Then, a description will be given to the details of the sealing step shown in FIG. 5. As described above, in the sealing step of the present embodiment, a transfer mold method is adopted in which a resin MRp (see FIG. 17) is fed into the space formed by the cavities CBT (see FIG. 13), then, the resin MRp is cured, thereby to form the sealing body MR (see FIG. 10). Thus, in the sealing step of the present embodiment, first, the mold die shown in FIGS. 13 and 14 is provided (mold die provision step). FIG. 13 is an enlarged plan view showing an example of the inner side surface (molted surface) of the mold die for use in the sealing step shown in FIG. 5. Whereas, FIG. 14 is an enlarged cross sectional view along line A-A of FIG. 13; and FIG. 15 is an enlarged cross sectional view along line B-B of FIG. 13.

Incidentally, in the present embodiment, the upper die MD1 and the lower die MD2 of the mold die MD are in a symmetric structure. Therefore, FIG. 13 is an enlarged plan view of any one of the upper die MD1 and the lower die MD2 shown in FIG. 14. However, the structures of the mold die MD include various modified examples other the structure shown in FIGS. 13 to 15. For example, it is essential only that the gate part MDg and the vent part MDv are formed in at least any one of the upper die MD1 and the lower die MD2.

As shown in FIG. 14, the mold die MD includes an upper die (first die) MD1 provided on a relatively upper side, and a lower die (second die) MD2 provided below the upper die MD1. Further, the upper die MD1 includes a clamp part MDc having a clamp surface (die surface, pressing surface, or surface) MDc1 for pressing the lead frame LF (see FIG. 10), and a cavity (concave part) CBT formed inside the clamp surface MDc1. Whereas, the lower die MD2 includes a clamp part MDc having a clamp surface (die surface, pressing surface, or surface) MDc2 arranged in such a manner as to face the clamp surface MDc1, and for pressing the lead frame LF, and a cavity (concave part) CBT formed inside the clamp surface MDc2.

Further, as shown in FIG. 13, the mold die MD has a gate part MDg communicating with the cavity CBT, and a vent part MDv provided opposite to the gate part MDg via the cavity CBT, and extending in a direction (first direction) DRC1. The gate part MDg and the vent part MDv are grooves formed in the mold die MD, and in the example shown in FIG. 15, are formed in each of the upper die MD1 and the lower die MD2. The gate part MDg is a feed port for feeding a resin into the cavities CBT in the sealing step. Whereas, the vent part MDv is an outlet port for discharging the gas (e.g., air) or the excess resin in the cavities CBT to outside the cavities CBT in the sealing step.

When a semiconductor package of a type in which a plurality of leads are exposed at each of the four sides of the sealing body MR is manufactured as shown in FIG. 1, the gate part MDg and the vent part MDv are respectively provided at the corner parts (the portions corresponding to the corner parts MRc of the sealing body MR shown in FIG. 1) of the cavity CBT formed in a tetragonal shape in a plan view as shown in FIG. 13. As a result, the resin fed into the cavities CBT in the sealing step flows from the corner part at which the gate part MDg is provided toward the diagonal corner part. Accordingly, insufficient filling of a resin becomes less likely to occur.

Further, in the example shown in FIG. 13, the gate part MDg is provided at one of the four corner parts of the cavity CBT, and the vent parts MDv are provided at other three corner parts, respectively. In this case, a resin becomes more likely to be filled in each of the three corner parts. However, from the viewpoint of discharging the gas in the cavities CBT, it is essential only that the vent part MDv is provided in at least one site. Therefore, as a modified example with respect to FIG. 13, the vent part MDv may be formed at only the corner part diagonal to the corner part at which the gate part MDg is provided. In other words, as a modified example, the vent part MDv is not required to be formed at other corner parts than the corner part diagonal to the corner part at which the gate part MDg is provided.

Figure 16:
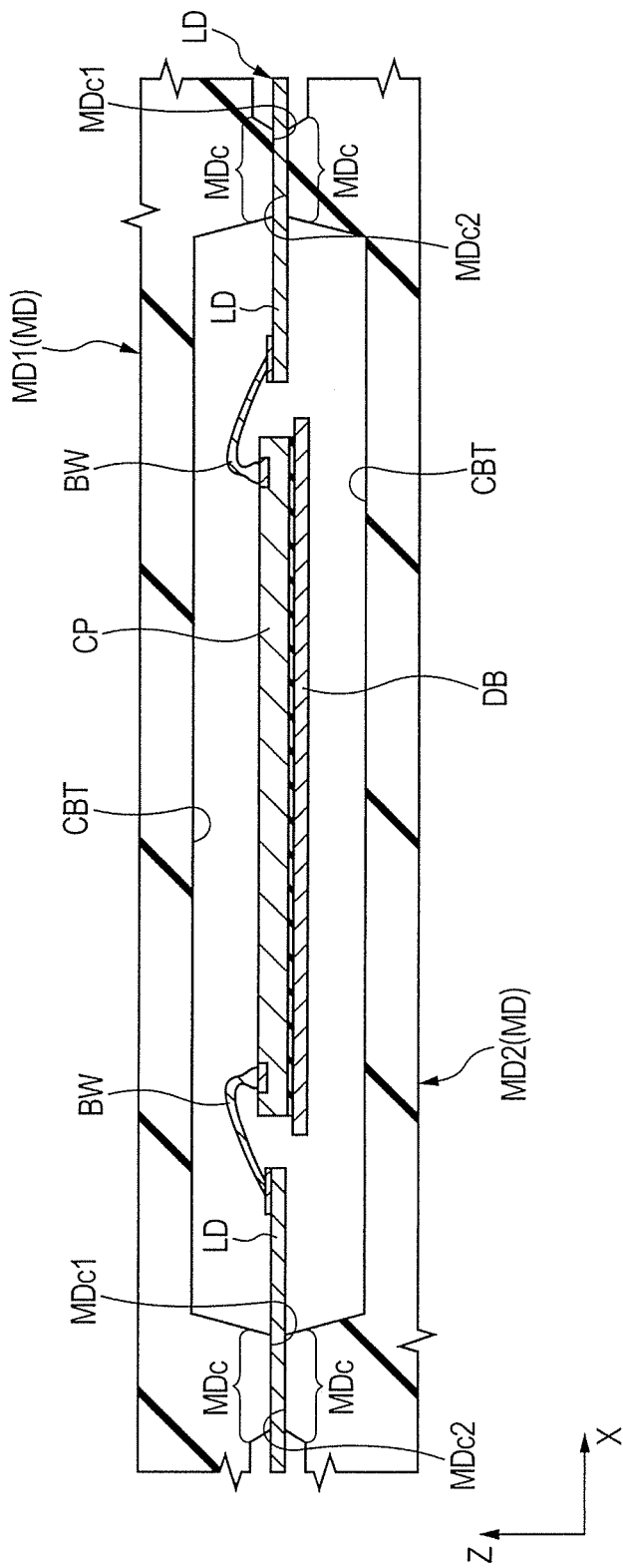
FIG. 16 is an enlarged cross sectional view showing a state in which a lead frame is arranged and clamped inside the mold die shown in FIG. 14.

Then, as shown in FIG. 16, the lead frame LF is arranged between the upper die MD1 and the lower die MD2 forming the mold die MD so that the semiconductor chip CP is situated in the cavities CBT of the mold die MD. Thus, the lead frame LF is clamped between the upper die MD1 and the lower die MD2 (clamp step). FIG. 16 is an enlarged cross sectional view showing a state in which the lead frame is arranged and clamed inside the mold die shown in FIG. 14.

In the clamp step, as shown in FIG. 16, the lead frame LF is arranged between the upper die MD1 and the lower die MD2 forming the mold die MD so that the semiconductor chip CP is situated in the cavities CBT of the mold die MD. Further, the clamp surface MDc1 of the upper die MD1 is brought into contact with the upper surface of the lead frame LF, and the clamp surface MDc2 of the lower die MD2 is brought into contact with the lower surface of the lead frame LF. As a result, the lead frame LF is interposed and clamped between the upper die MD1 and the lower die MD2. As shown in FIG. 13, the clamp part MDc having the clamp surface MDc1 or the clamp surface MDc2 is provided in such a manner as to surround the periphery of the cavity CBT. For this reason, in the clamp step, the part of each device region of the lead frame LF shown in FIG. 9 other than the region overlapping the cavities CBT, the gate part MDg, and a plurality of vent parts MDv shown in FIG. 13 is clamped. In other words, during the period from the clamp step to the base material extraction step, the space in the cavities CBT shown in FIG. 16 becomes an airtight space except for the gate part MDg, and the plurality of vent parts MDv shown in FIG. 13. As a result, in the resin feed step shown in FIG. 5, the resin can be suppressed from leaking to outside the clamped region.

Figure 17:
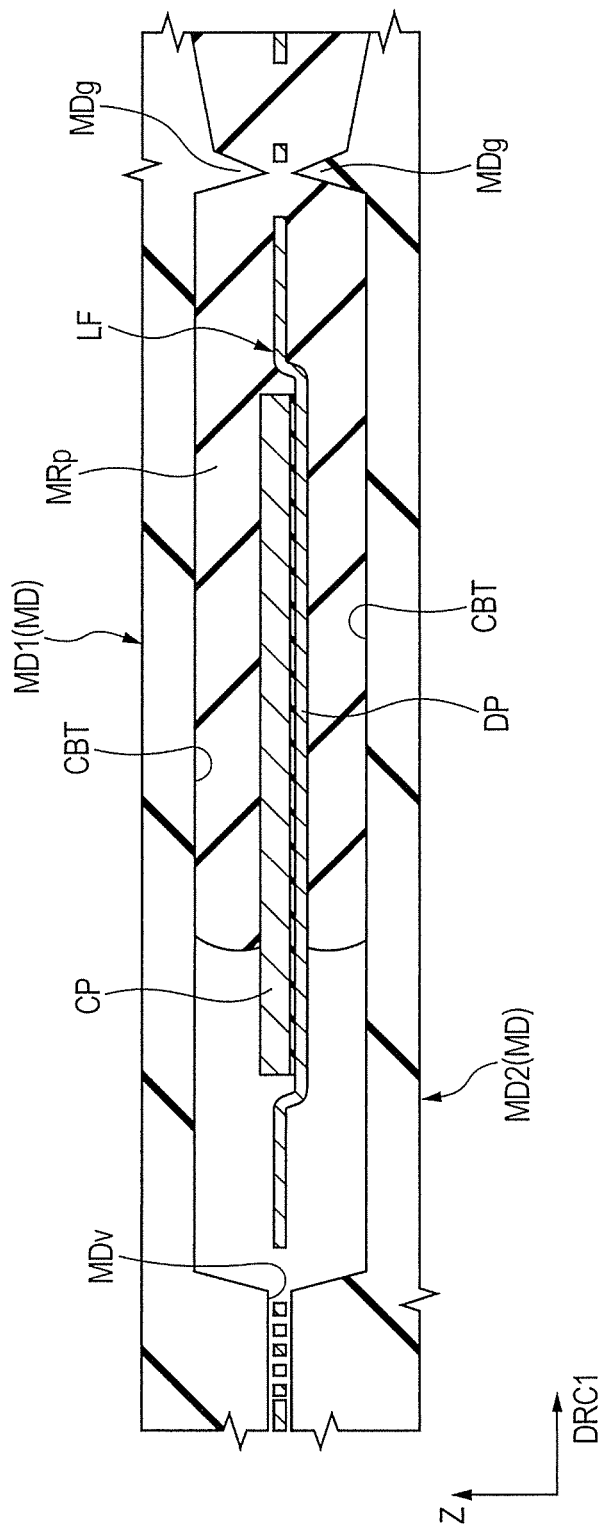
FIG. 17 is an enlarged cross sectional view showing a state in which the lead frame is arranged and clamped inside the mold die shown in FIG. 15, followed by feeding of a resin.
Figure 18:
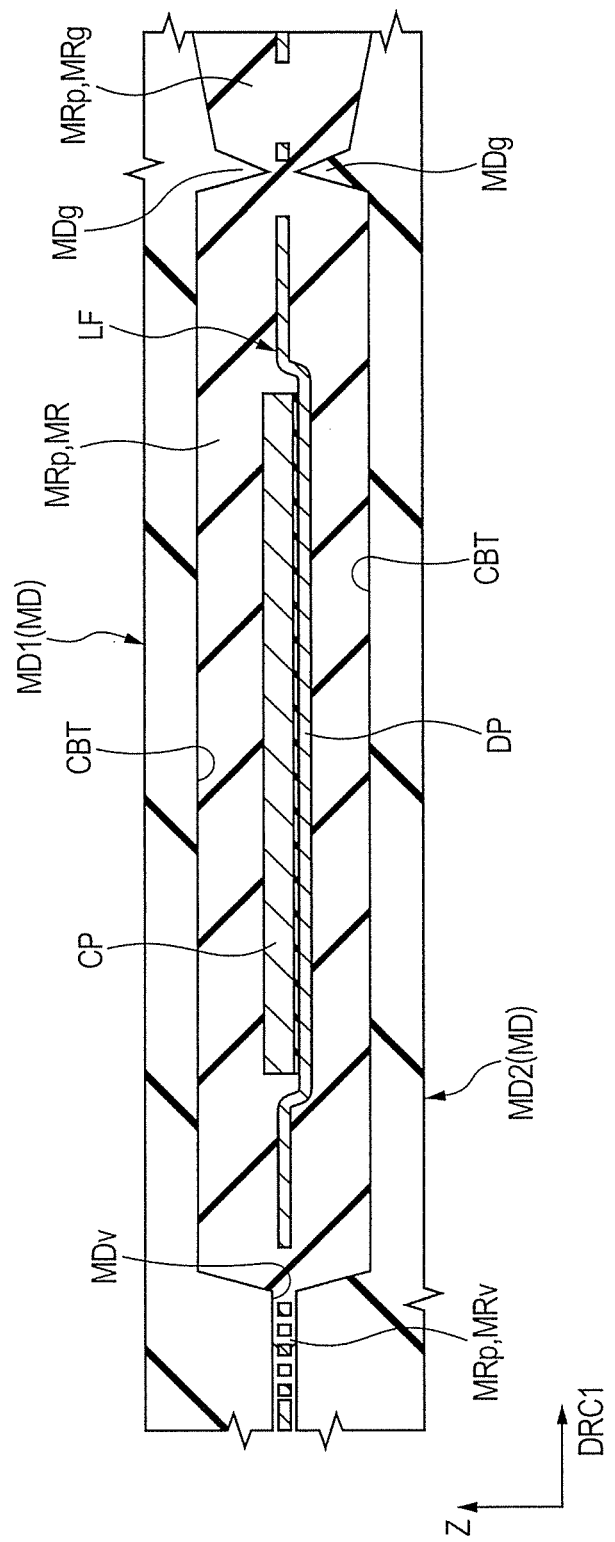
FIG. 18 is an enlarged cross sectional view showing a state upon completion of feeding of a resin into the cavities shown in FIG. 17.

Then, as shown in FIG. 17, a resin MRp is fed into the space surrounded by the cavities CBT (resin feed step). FIG. 17 is an enlarged cross sectional view showing a state in which the lead frame is arranged and clamped inside the mold die shown in FIG. 15, followed by feeding of a resin. Whereas, FIG. 18 is an enlarged cross sectional view showing a state upon completion of feeding of a resin into the cavities shown in FIG. 17.

In the resin feed step, the resin MRp softened by heating at a charging part of a resin called a cull (not shown) is forced into the space surrounded by the cavities CBT from the gate part MDg. The resin forced into the cavities CBT advances toward the vent part MDv while sealing the semiconductor chip CP and the plurality of wires BW arranged in the cavities CBT (see FIG. 9). At this step, the gas (e.g., air) in the space surrounded by the cavities CET is discharged through the vent part MDv. Then, when feeding of the resin MRp is continued to such an extent that a part of the resin MRp leaks into the vent part MDv as shown in FIG. 18, the gas in the cavities CBT can be discharged to outside the cavities CBT. This can suppress bubbles from being left in the sealing body MR shown in FIG. 2.

Then, the resin filled in the cavities CBT is cured (resin curing step). The sealing step is performed with the mold die MD being heated. In the resin curing step, the resin MRp fed into the cavities CBT is cured by heat.

Figure 19:
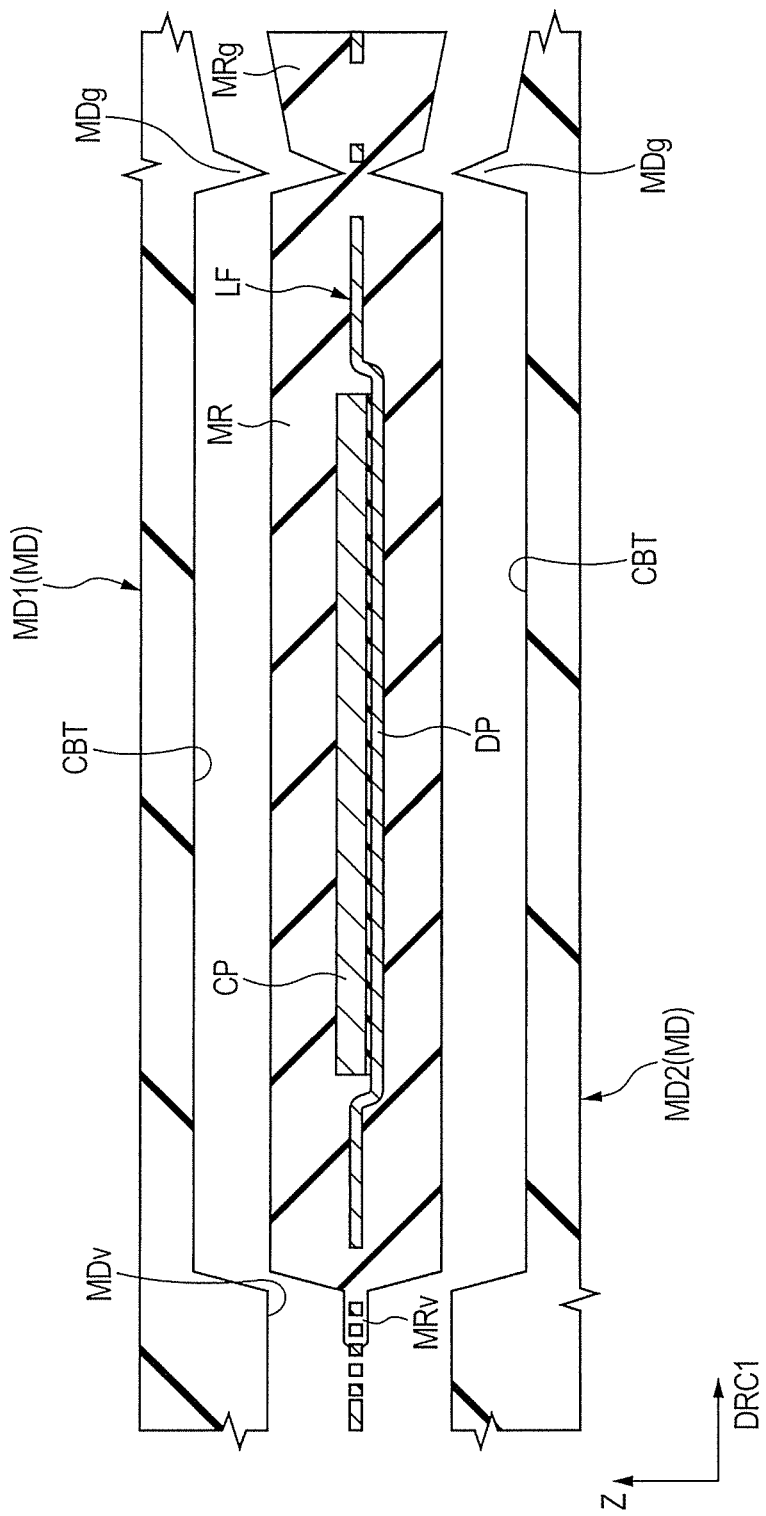
FIG. 19 is an enlarged cross sectional view showing a state in which after curing the resin shown in FIG. 18, the upper die and the lower die of the mold die are separated from each other, so that the lead frame is extracted.

Then, as shown in FIG. 19, the upper die MD1 and the lower die MD2 are separated from each other, so that the lead frame LF is extracted from the mold die MD (base material extraction step). FIG. 19 is an enlarged cross sectional view showing a state in which after curing the resin shown in FIG. 18, the upper die and the lower die of the mold die are separated from each other, so that the lead frame is extracted.

In the base material extraction step, the upper die MD1 and the lower die MD2 are each separated from the sealing body MR. At this step, when the gate resin MRg formed at the gate part MDg, and the vent resin MRv formed at the vent part MDv are left in a fixed state at the lead frame LF as shown in FIG. 19, the residue of the resin MRp (see FIG. 18) is not deposited at the mold die MD.

However, a study by the present inventors indicates as follows: the vent resin MRv is partially broken off, and is left as a residual resin at the vent part MDv of the mold die MD according to the structure of the vent part MDv, and the structure of the portion of the lead frame LF overlapping the vent part MDv. Then, when a residual resin is left in the groove of the vent part MDv, it is feared that the gas in the cavities CBT becomes unable to be properly discharged in the next step of sealing the lead frame LF. Further, when the residual resin removal step of removing the residual resin in the vent part MDv is performed for every sealing step, the manufacturing efficiency of the semiconductor device is reduced. Particularly, when the sealing body MR is formed collectively for a large number of device regions LFa included in the lead frame LF as shown in FIG. 6, the number of vent parts MDv formed in one mold die MD is large. Thus, a considerable time is required for removing respective residual resins of the large number of vent parts MDv. Under such circumstances, the present inventors conducted a study on a technology of suppressing the cause of the residual resin being left in the vent part MDv, and the generation of the residual resin.

Figure 20:
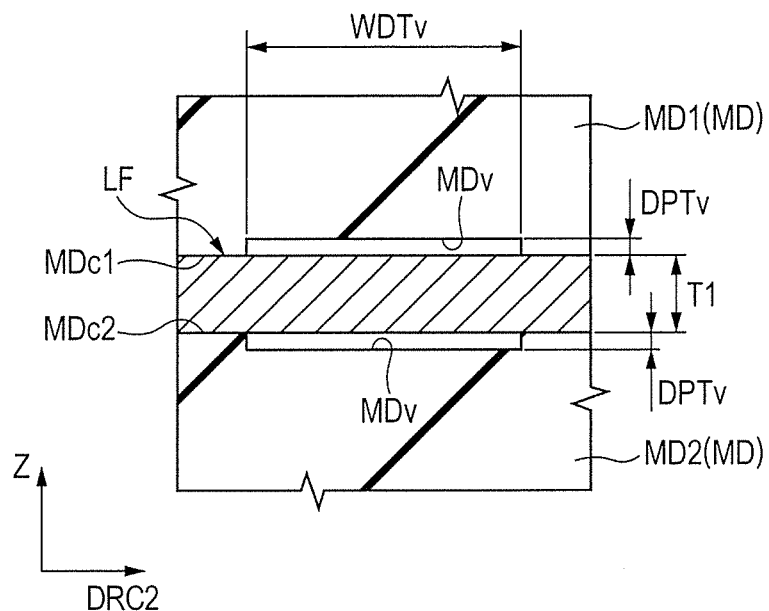
FIG. 20 is an enlarged cross sectional view showing an example of the groove depth of the vent part in the cross section along line C-C of FIG. 13.
Figure 21:
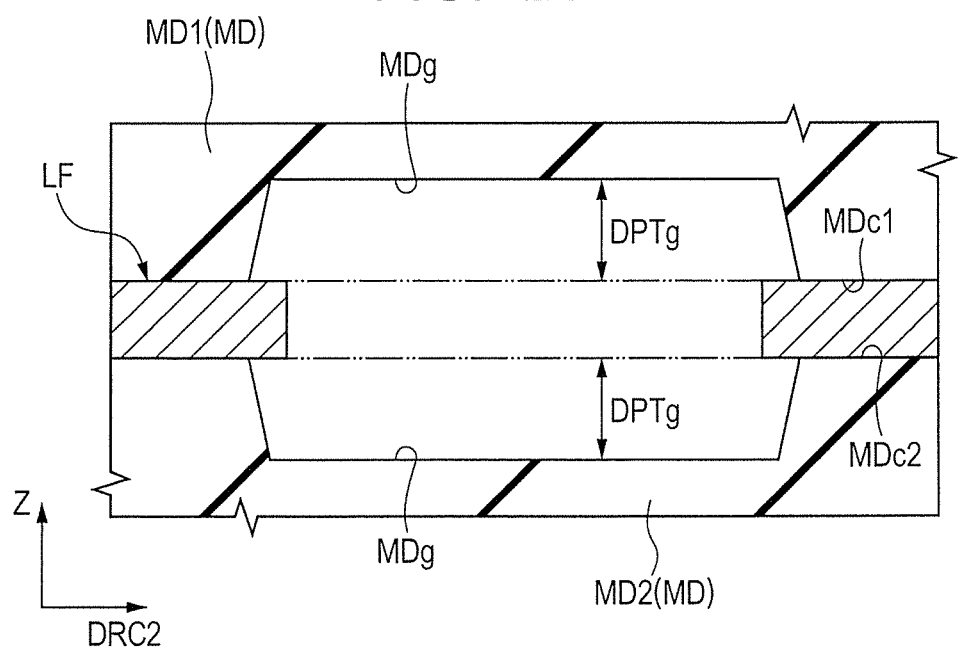
FIG. 21 is an enlarged cross sectional view showing the relation between the gate part and the lead frame in the cross section along line D-D of FIG. 13.

FIG. 20 is an enlarged cross sectional view showing an example of the groove depth of the vent part in the cross section along line C-C of FIG. 13. Whereas, FIG. 21 is an enlarged cross sectional view showing the relation between the gate part and the lead frame in the cross section along line D-D of FIG. 13. Incidentally, FIG. 21 shows the cross section of the gate part MDg shown in FIG. 17 at a portion thereof (the tip portion of the projecting part) at which the distance between the gate part MDg and the lead frame LF is minimum. Further, the through hole provided at a position of the lead frame LF shown in FIG. 21 over lapping the gate part MDg is indicated with a two-dot chain line.

As indicated from the comparison between FIG. 20 and FIG. 21, the groove depth DPTv of the vent part MDv shown in FIG. 20 is shallower than the groove depth DPTg of the gate part MDg shown in FIG. 21. Further, the groove depth DPTv of the vent part MDv shown in FIG. 20 is shallower than the thickness T1 of the lead frame LF. In the example shown in FIG. 20, the groove depth DPTv defined as the distance between the bottom surface of the vent part MDv and the clamp surface MDc1 of the upper die MD1, or the distance between the bottom surface of the vent part MDv and the clamp surface MDc2 of the lower die MD2 is about 30 μm to 50 μm. Whereas, the thickness of the lead frame LF is about 125 μm to 250 μm. Further, in the example shown in FIG. 21, the groove depth DPTg defined as the distance between the tip of the gate part MDg and the clamp surface MDc1 of the upper die MD1, or the distance between the tip of the gate part MDg and the clamp surface MDc2 of the lower die MD2 is about 150 μm to 250 μm. Whereas, the groove width WDTv of the vent part MDv in a direction DRC2 shown in FIG. 20 is larger than the groove depth DPTv, and is for example, about 0.4 mm to 1 mm.

The gate part MDg is a feed port for a resin MRp (see FIG. 17). For this reason, a certain degree of wide opening area is required so as to facilitate feeding of the resin MRp into the cavities CBT (see FIG. 17). On the other hand, the vent part MDv is an opening for discharging the gas in the cavities CBT. For this reason, when the opening area of the vent part MDv is increased, it becomes difficult to increase the inner pressure (static pressure) of the space surrounded by the cavities CBT in the resin feed step. This causes prevention of the resin MRp from being fed to a part of the inside of the cavities CBT. Whereas, when the opening area of the vent part MDv is increased, the resin MRp becomes more likely to leak from through the vent part MDv. Thus, in order to reduce the opening area of the vent part MDv, the groove depth DPTv of the vent part MDv is shallower than the groove depth DPTg of the gate part MDg.

As described above, when the groove depth DPTv of the vent part MDv is shallow, the thickness (the height in the Z direction of FIG. 19) of the vent resin MRv (see FIG. 19) is thin. Thus, it has been indicated as follows: when the thickness of the vent resin MRv is thin, in the base material extraction step, the vent resin MRv tends to be partially broken off, and to become a residual resin. Particularly, it has been indicated as follows: when a through hole, or the like is not formed at a position of the lead frame LF overlapping the vent part MDv, a residual resin tends to be generated.

Figure 22:
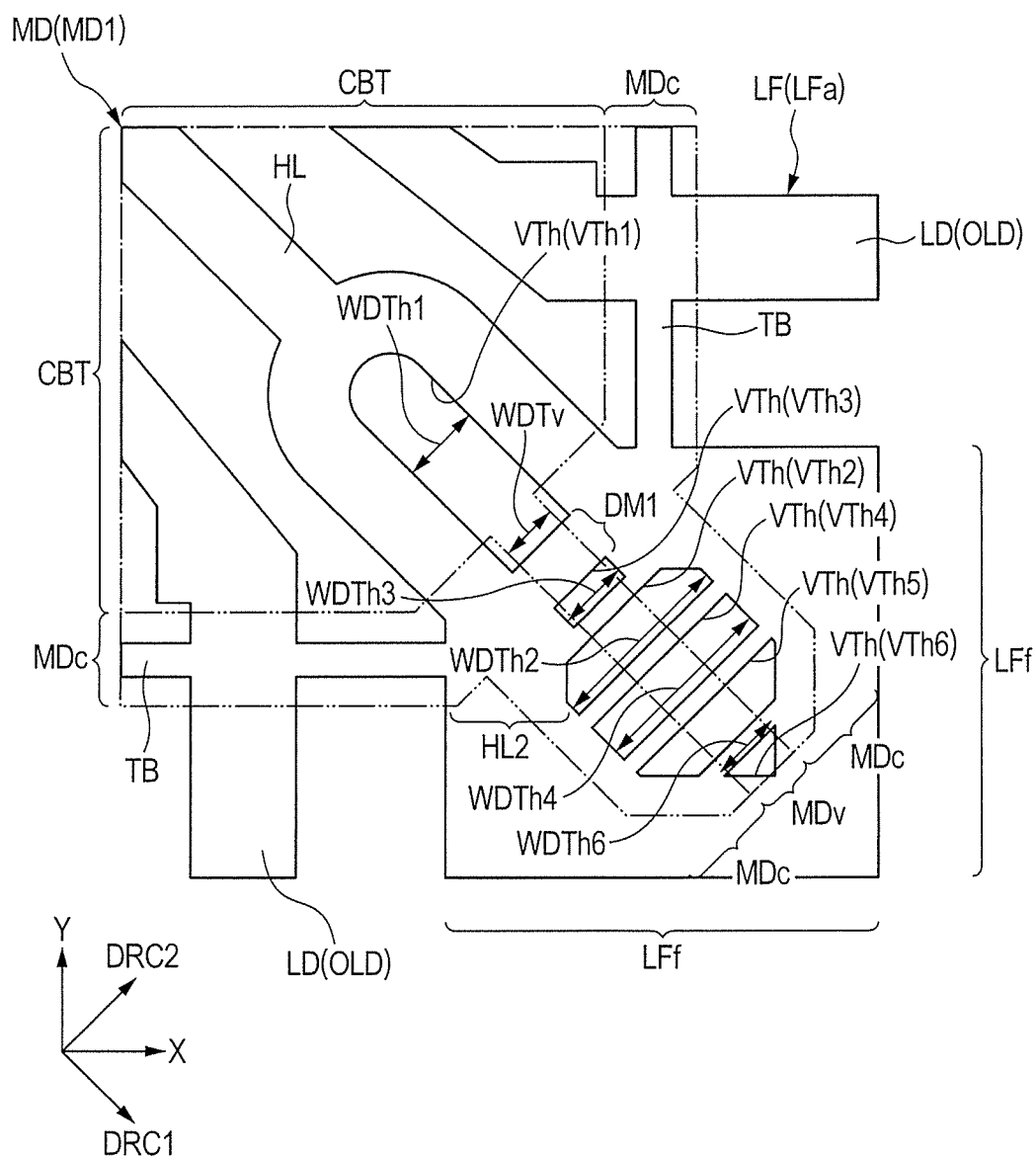
FIG. 22 is a perspective plan view showing a state in which the mold die shown in FIG. 13 is stacked in the enlarged plan view of the part A shown in FIG. 9.
Figure 23:
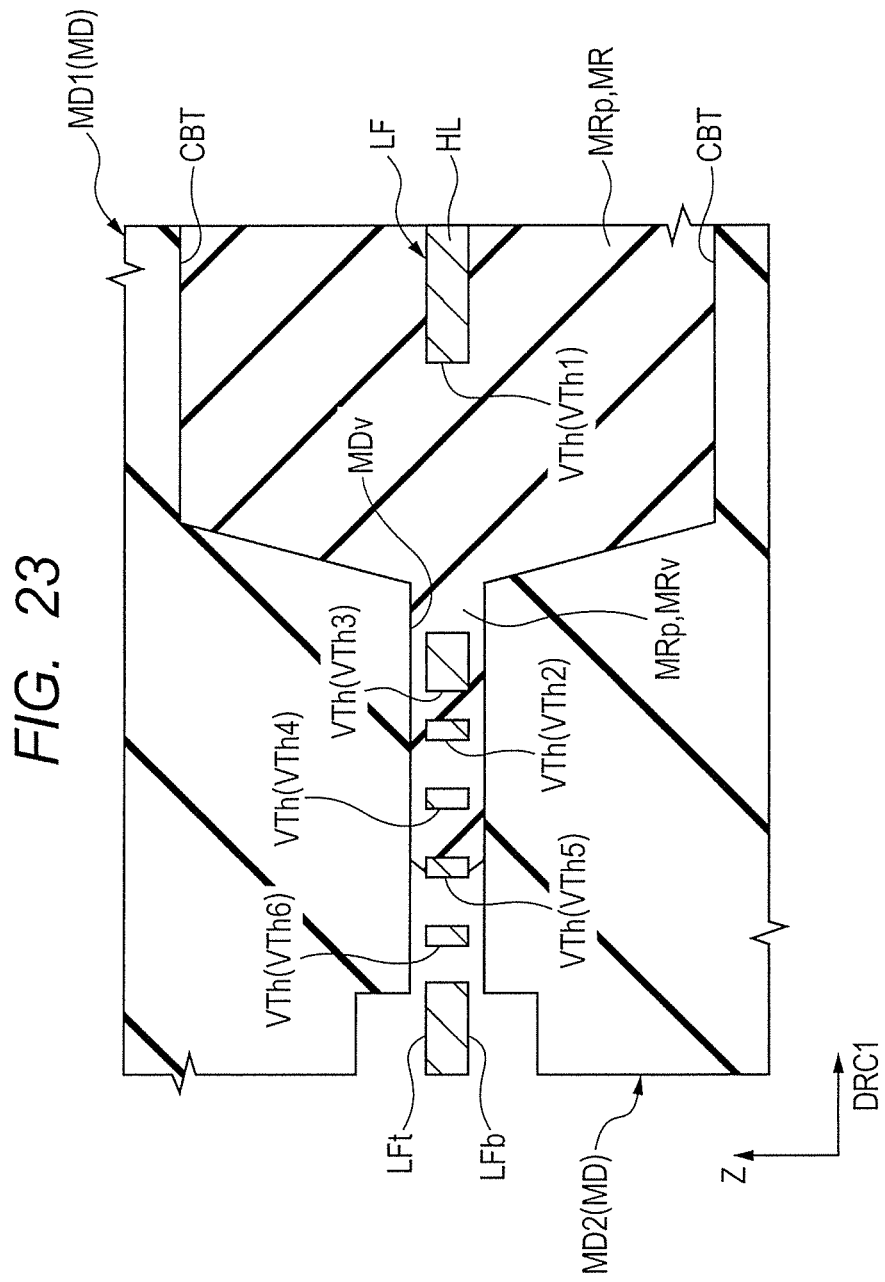
FIG. 23 is an enlarged cross sectional view of the periphery of the vent part shown in FIG. 18 on a further enlarged scale.
Figure 24:
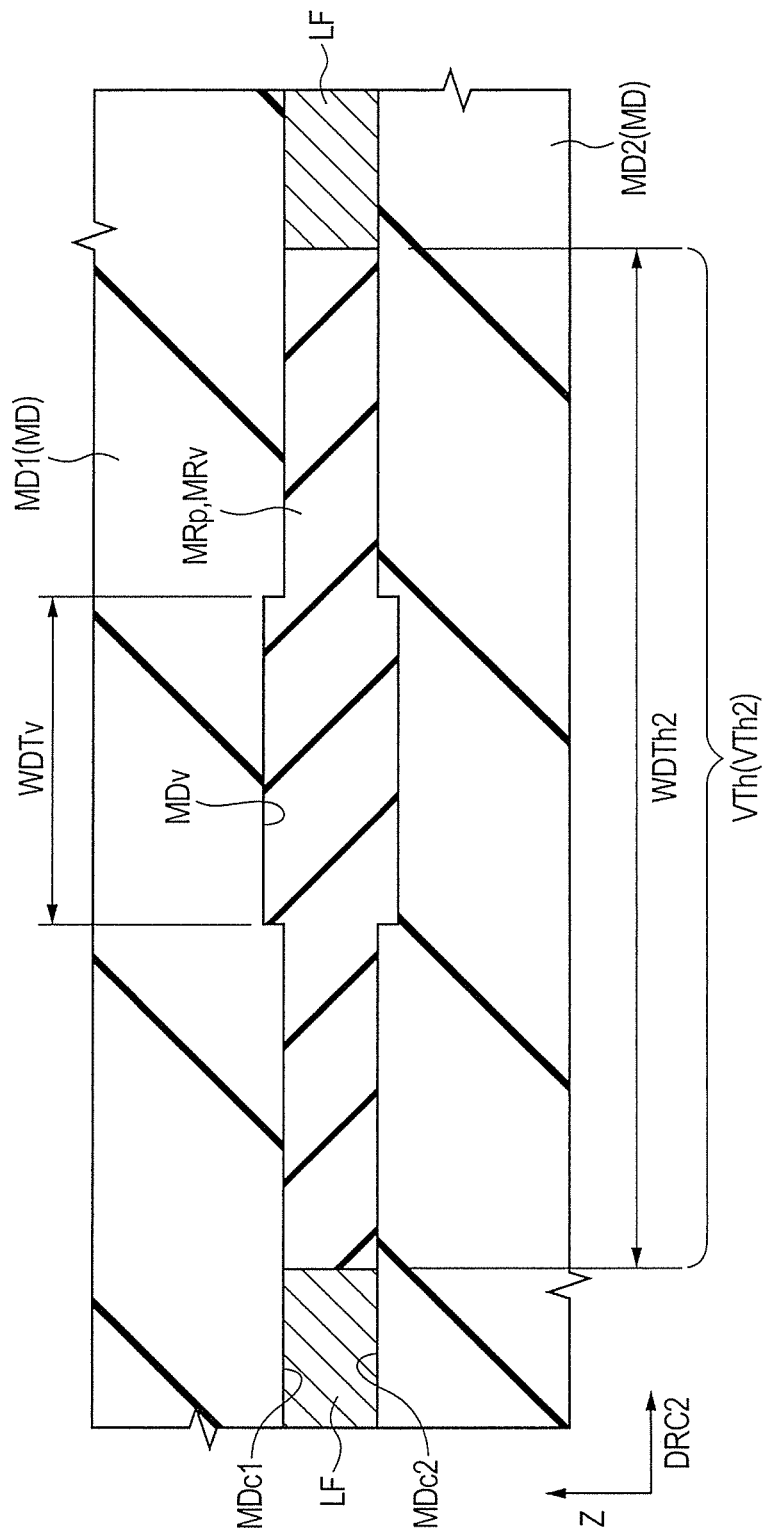
FIG. 24 is an enlarged cross sectional view of the through hole VTh2 in the width direction (direction DRC2) of a plurality of through holes shown in FIG. 22.
Figure 27:
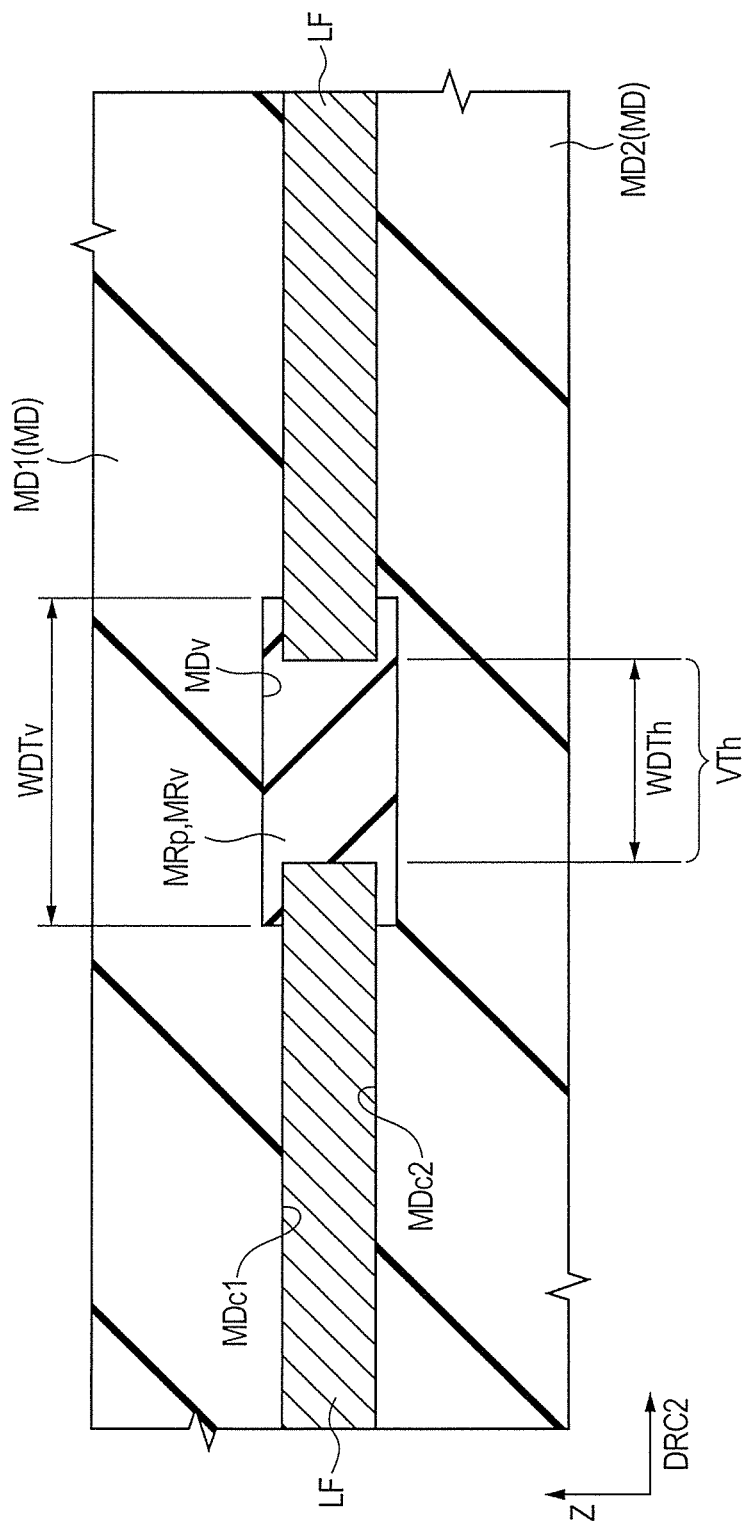
FIG. 27 is an enlarged cross sectional view showing Comparative Example with respect to FIG. 24.

Under such circumstances, the present inventors conducted a study on the following method: as shown in FIGS. 22 and 23, through holes (openings) VTh are provided at positions overlapping the vent part MDv in a thickness direction in the clamp step, thereby to increase the thickness of the vent resin MRv; as a result, the vent resin MRv is suppressed from being broken off. FIG. 22 is a perspective plan view showing a state in which the mold die shown in FIG. 13 is stacked in the enlarged plan view of the part A shown in FIG. 9. Whereas, FIG. 23 is an enlarged cross sectional view of the periphery of the vent part shown in FIG. 18 on a further enlarged scale. Further, FIG. 24 is an enlarged cross sectional view of the through hole VTh2 in the width direction (direction DRC2) of a plurality of through holes shown in FIG. 22. Further, FIG. 27 is an enlarged cross sectional view showing Comparative Example with respect to FIG. 24.

As shown in FIG. 22, the lead frame LF of the present embodiment has a plurality of through holes VTh provided at positions overlapping the vent part MDv of the mold die MD in the clamp step shown in FIG. 5. Thus, the through holes VTh are provided at positions overlapping the vent part MDv of the mold die MD. As a result, as shown in FIGS. 23 and 24, the thickness of the vent resin MRv formed at the vent part MDv can be increased.

However, a study by the present inventors indicates as follows: the residual resin may be generated according to the shape and the layout of the through holes VTh provided at positions overlapping the vent part MDv of the mold die MD. For example, when the length (opening width) of the through hole VTh is smaller than the groove width WDTv of the vent part MDv in a direction DRC2 as with the through hole VTh included in the lead frame LFh shown in FIG. 27, in the base material extraction step shown in FIG. 5, a residual resin tends to be generated. Particularly, in the base material extraction step, when the lead frame LF is extracted from the mold die MD, the vent resin MRv formed at a position overlapping the vent part MDv is applied with a stress. When the stress is concentrated to a part of the vent resin, a part of the vent resin MRv may be damaged due to the stress. For example, when the vent resin MRv is damaged with the portion of the vent resin MRv formed at the vent part MDv shown in FIG. 27 interposed between the lead frame LF and the vent part MDv as a starting point, the vent resin MRv is partially broken, and becomes more likely to remain in the vent part MDv.

Further, although not shown, also when only the through hole VTh1 provided at a position overlapping the cavities CBT in the clamp step is provided, and the through hole VTh2, the through hole VTh3, the through hole VTh4, the through hole VTh5, and the through hole VTh6 shown in FIG. 22 are not provided, respectively, a residual resin tends to be generated. Particularly, a stress tends to be concentrated to the tip portion of the vent resin MRv formed at the vent part MDv outside the through hole VTh1. Then, when the vent resin MRv is damaged with the vicinity of the stress-concentrated tip portion as a starting point, the vent resin MRv is less likely to be separated from the mold die MD, and becomes more likely to remain in the vent part MDv.

The lead frame LF of the present embodiment has the through hole VTh1 provided at a position overlapping the cavities CBT in the clamp step, and the through hole VTh2 provided outside the through hole VTh1 with respect to the die pad DP (see FIG. 9), and provided at a position overlapping the vent part MDv in the clamp step as shown in FIG. 22.

The through hole VTh1 is a channel for efficiently discharging the gas in the cavities CBT into the vent part MDv, and extends in such a manner as to extend across the space surrounded by the cavities CBT, and the space surrounded by the vent part MDv provided outside the cavities CBT. In the example shown in FIG. 22, the through hole VTh1 is surrounded by the suspending leads HL. Particularly, one end of each suspending lead HL is coupled with the die pad DP as shown in FIG. 7. Whereas, the other end of the suspending lead HL is connected with the frame part LFf to which a plurality of leads LD are connected. Further, each suspending lead HL is bifurcated between the frame part LFf of the lead frame LF and the die pad DP. Respective bifurcated ends are connected with the frame part LFf. The through hole VTh1 shown in FIG. 22 is surrounded by the bifurcated suspending lead HL and the frame part LFf.

Further, the through hole VTh1 is a through hole VTh formed from the viewpoint of suppressing the generation of the residual resin, or from the viewpoint of reducing the leakage amount of the resin MRp (see FIG. 17) into the vent part MDv as described later, and is provided at a position not overlapping the cavities CBT, and overlapping the vent part MDv.

When, other than the through hole VTh1, the through hole VTh2 is provided at a position overlapping the vent part MDv in the clamp step, as shown in FIG. 23, the vent resin MRv is formed in such a manner as to cover a part of the lead frame LF (the portions between the plurality of through holes VTh shown in FIG. 23). For this reason, when in the base material extraction step, the mold die MD and the vent resin MRv are separated from each other, the vent resin MRv becomes more likely to remain on the lead frame LF side. In other words, the vent resin MRv becomes more likely to be released from the mold die.

Further, in the lead frame LF of the present embodiment, as shown in FIG. 22, the length WDTh2 of the through hole VTh2 is longer than the groove width (length) WDTv of the vent part VDv in a direction DRC2 crossing with (orthogonal to in the example of FIG. 22) the direction DRC1 of extension of the vent part MDv. Further, as shown in FIG. 24, in the resin feed step, the resin MRp spreads from the vent part MDv to the entire through hole VTh2, so that the through hole VTh2 is filled with the resin MRp. For this reason, for example, the shape of the vent resin MRv formed by filling the resin MRp in the through hole VTh2 for curing in the cross section shown in FIG. 24 does not have a portion interposed between the lead frame LF and the mold die MD.

Therefore, the damage of the vent resin MRv can be more suppressed than when the sealing step is performed on the lead frame LFh shown in FIG. 27. In other words, in the base material extraction step, the stress concentration to a part of the vent resin MRv can be suppressed.

As described above, in accordance with the present embodiment, it is possible to suppress the generation of a residual resin remaining at the vent part MDv of the mold die MD in the base material extraction step. Then, suppression of the generation of a residual resin eliminates the necessity of performing the step of removing the residual resin of the mold die MD each time when the resin feed step is performed. For this reason, it is possible to improve the manufacturing efficiency of the semiconductor device. Further, by suppressing the generation of the residual resin of the mold die MD, the gas in the cavities CBT can be properly discharged when the plurality of lead frames LF are continuously subjected to the sealing step.

Incidentally, when attention is paid on only the viewpoint of increasing the thickness of the vent resin MRv, an opening like a groove not penetrating through the lead frame LF may be provided at the lead frame LF in place of the through hole VTh2. However, as described above, in order to cover a part of the lead frame LF with the vent resin MRv, it is preferable to provide a through hole VTh2 penetrating through one surface to the other surface of the upper surface LFt and the lower surface LFb of the lead frame LF as shown in FIG. 23.

Figure 28:
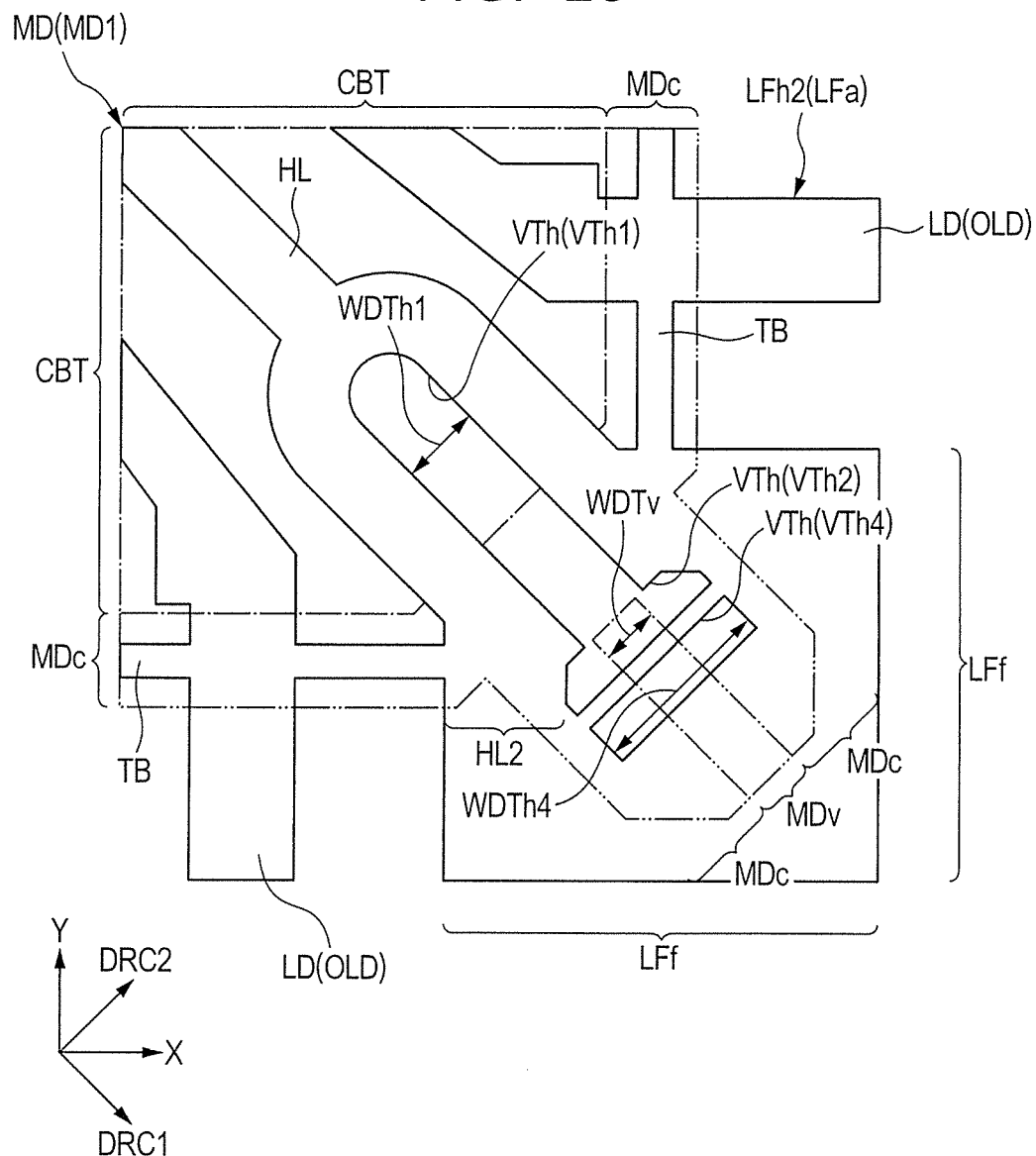
FIG. 28 is an enlarged plan view showing Study Example with respect to FIG. 22.

Whereas, the following can also be considered: as with the lead frame LFh2 of Study Example shown in FIG. 28, the through hole VTh1 shown in FIG. 22 is allowed to further extend along the direction of extension of the vent part MDv, and to be connected with, for example, a through hole VTh3 (see FIG. 22) and a through hole VTh2. In this case, the vent part MDv of the mold die MD does not communicate with the cavities CBT. The space surrounded by the cavities CBT, and the vent part MDv are coupled with each other via the through hole VTh1. However, in the case of the lead frame LFh2, the through hole VTh1 and the through hole VTh2 are connected with each other. For this reason, there is no member for damming up the flow of the resin MRp until the resin MRp (see FIG. 17) reaches the through hole VTh2. Further, the thickness of the lead frame LFh2 is, for example, 150 μm to 250 μm, and is three times or more the groove depth DPT1 of the vent part MDv shown in FIG. 20. For this reason, the flow rate of the resin MRp flowing into the through hole VTh1 becomes higher. Accordingly, it is difficult to dam up the leakage of the resin MRp at the positions of the through hole VTh2 and the through hole VTh4.

Whereas, in the case of Study Example shown in FIG. 28, the vent part MDv and the cavity CBT does not communicate with each other. For this reason, between the through hole VTh2 and the through hole VTh4, stress concentration to the vent resin MRv (see FIG. 18) is caused, which may break the vent resin MRv.

On the other hand, the lead frame LF of the present embodiment has a dam part DM1 for damming up the flow of the resin MRp (see FIG. 17) between the through hole VTh2 and the through hole VTh1 (in the example shown in FIG. 22, between the through hole VTh3 and the through hole VTh1) as shown in FIG. 22. When the dam part DM1 is thus provided in the vicinity of the cavities CBT, the flow rate of the resin MRp can be reduced in the vicinity of the outlet of the cavities CBT. For this reason, the leakage of the resin MRp can be dammed up at the positions of the through hole VTh2 and the through hole VTh4. Whereas, when the dam part DM1 is provided in the vicinity of the cavities CBT as in the present embodiment, the cavities CBT and the vent part MDv are allowed to communicate with each other. As a result, it is possible to surely ensure the channel for discharging the gas in the cavities CBT to the outside.

Figure 25:
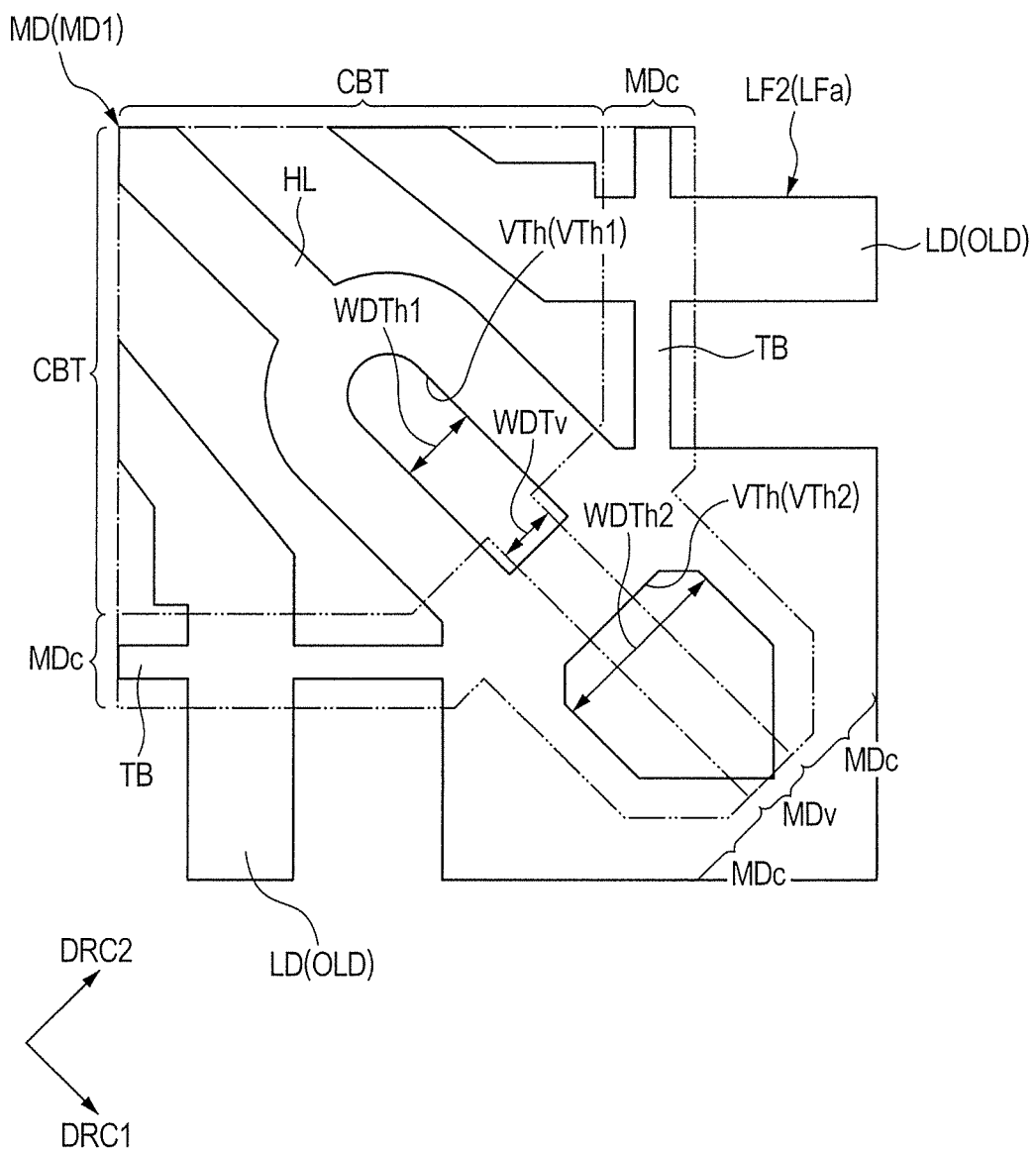
FIG. 25 is an enlarged plan view showing Modified Example with respect to FIG. 22.

Incidentally, to simplify the foregoing configuration, namely, the point that the through hole VTh2 overlapping the vent part MDv is provided outside the through hole VTh1 provided at a position overlapping the cavities CBT in the clamp step, and the point that the length WDTh2 of the through hole VTh2 in the direction DRC2 is larger than the groove width WDTv of the vent part MDv, Modified Example shown in FIG. 25 is also acceptable. FIG. 25 is an enlarged plan view showing Modified Example with respect to FIG. 22.

The lead frame LF2 shown in FIG. 25 is different from the lead frame LF shown in FIG. 22 in that the through hole VTh2, the through hole VTh4, the through hole VTh5, and the through hole VTh6 shown in FIG. 22 are connected with one another, and in that the through hole VTh2 with a large opening area is formed. Further, the lead frame LF2 is different from the lead frame LF shown in FIG. 22 in that the through hole VTh3 shown in FIG. 22 is not formed.

When the sealing step shown in FIG. 5 is performed using the lead frame LF2, the generation of a residual resin can be more suppressed than the case of the lead frame LFh shown in FIG. 27. However, when one through hole VTh2 having a large opening area is provided as with the lead frame LF2, the portion of the vent resin MRv (see FIG. 24) embedded in the through hole VTh2 is increased in rigidity. For this reason, in the base material extraction step, when a stress is concentrated to the portion of the vent resin MRv between the through hole VTh1 and the through hole VTh2 shown in FIG. 25, this portion may become a starting point for damage.

Thus, from the viewpoint of suppressing stress concentration in the base material extraction step, a plurality of through holes VTh separated from one another are preferably provided outside the through hole VTh1 as with the lead frame LF shown in FIG. 22. When the plurality of through holes VTh separated from one another are thus provided outside the through hole VTh1, the portions of the vent resin MRv (see FIG. 24) respectively embedded in the through holes VTh are reduced in volume. As a result, the stress applied to the vent resin MRv in the base material extraction step is dispersed. This can suppress the damage of the vent resin MRv.

Further, when the plurality of through holes VTh separated from one another are thus provided outside the through hole VTh1, as shown in FIG. 23, a plurality of portions of the lead frame LF are respectively covered with the vent resin MRv. In this case, even when any one site of the vent resin MRv is broken at the contact interface between the vent resin MRv and the lead frame LF, the broken portion of the vent resin MRv does not remain at the mold die MD unless other portions are broken.

Further, as shown in FIG. 22, the length in the direction DRC1 of each of the plurality of through holes VTh provided outside the through hole VTh1 is smaller than the length in the direction DRC2 of each of the plurality of through holes VTh. For example, the length in the direction DRC1 of the through hole VTh2 is smaller than the length WDTh2 in the direction DRC2 of the through hole VTh2. Whereas, the length in the direction DRC1 of the through hole VTh3 is smaller than the length WDTh3 in the direction DRC2 of the through hole VTh3. Further, the length in the direction DRC1 of the through hole VTh4 is smaller than the length WDTh4 in the direction DRC2 of the through hole VTh4. Thus, by shortening the length in the direction DRC1 of each of the plurality of through holes VTh, it is possible to provide a large number of through holes VTh in a limited space. In this case, it is possible to surely reduce the volume of the portion of the vent resin MRv (see FIG. 24) embedded in each through hole VTh.

Further, in order to suppress the generation of the residual resin, preferably, the amount of the resin MRp leaking into the vent part MDv shown in FIG. 17 in the resin feed step shown in FIG. 5 is reduced, thereby to reduce the amount of the vent resin MRv. From the viewpoint of reducing the amount of the resin MRp leaking into the vent part MDv, it is preferable to increase the length WDTh2 in the direction DRC2 of the through hole VTh2 shown in FIG. 22. Below, the reason will be described.

As described above, the sealing step is performed with the mold die MD being heated. In the resin curing step, the resin MRp fed into the cavities CBT is cured by heat. In conjunction with FIG. 5, the resin feed step and the resin curing step have been separately described. However, the mold die MD is heated also during the resin feed step. For this reason, the resin MRp shown in FIG. 17 moves while being gradually cured. The heat for heating the resin MRp is transferred via the mold die MD. Accordingly, an increase in contact area between the mold die MD and the resin MRp promotes the curing rate of the resin MRp.

Herein, when the through hole VTh is provided at a position overlapping the vent part MDv as shown in FIG. 24, the resin MRp flows in such a manner as to be embedded in the through hole VTh. For this reason, the advance speed of the resin MRp along the direction DRC1 (see FIG. 22) is reduced. Whereas, an increase in length WDTh2 in the direction DRC2 of the through hole VTh2 results in an increase in contact area between the resin MRp and the mold die MD. For this reason, at the vent part MDv, the curing rate of the resin MRp is promoted. Upon curing of the resin MRp, the viscosity of the resin MRp increases, resulting in an increase in resistance acting in a direction opposite to the direction of feeding of the resin MRp. As a result, it is possible to reduce the leakage amount of the resin MRp.

In the example shown in FIG. 22, in the direction DRC2, the length WDTh2 of the through hole VTh2 is larger than the length WDTh1 of the through hole VTh1, and the length WDTh2 in the direction DRC2 of the through hole VTh2 is larger than the length in the direction DRC1 of the through hole VTh2. For this reason, the resin MRp (see FIG. 17) which has reached the through hole VTh2 tends to flow in the length direction of the through hole VTh2, namely, the direction of the direction DRC2. Then, the entire through hole VTh2 is covered with the clamp part MDc or the vent part MDv of the mold die MD. For this reason, the resin MRp tends to be in contact with the mold die MD, and to be cured.

Further, in the example shown in FIG. 22, the length WDTh4 of the through hole VTh4 provided separated from the through hole VTh2 is larger than the length WDTh1 of the through hole VTh1, and the length WDTh4 in the direction DRC2 of the through hole VTh4 is larger than the length in the direction DRC1 of the through hole VTh4. Therefore, also with the through hole VTh4, the flow rate of the resin MRp can be reduced.

Further, when attention is paid on the effect of reducing the leakage amount of the resin MRp, the following case is particularly effective. Namely, when the viscosity of the resin MRp is reduced, the resin MRp becomes more likely to leak at the vent part MDv. For this reason, in order to reduce the leakage amount of the resin MRp, the viscosity of the resin MRp is preferably increased. However, the viscosity of the resin MRp may have to be reduced due to other factors.

For example, when each wire diameter of the plurality of wires BW shown in FIG. 9 becomes thinner, each wire BW becomes more likely to be bent by an external force (the force pressed by the resin MRp in the resin feed step). Further, the ease of bending of the wire BW differs according to the material of the wire BW. For example, the wire BW formed of gold (Au) is more likely to be bent than the wire BW formed of copper (Cu). When the wire BW thus tends to be bent by the pressing force of the resin MRp, the constituent materials of the resin MRp are required to be adjusted, thereby to reduce the viscosity.

The present inventors conducted a study on the relation between the materials and the wire diameter of the wire BW, and the ease of leakage of the resin MRp at the vent part MDv. This indicates as follows: the phenomenon that the resin MRp becomes more likely to leak becomes noticeable when a plurality of wires BW are respectively formed of gold, and the wire diameter (diameter) of the wire BW is 20 µm or less.

Thus, when the plurality of wires BW are respectively formed of gold, and the wire diameter (diameter) of the wire BW is 20 µm or less, it is preferable to take measures for reducing the leakage amount of the resin as described above. Namely, as shown in FIG. 22, the lead frame LF preferably has a dam part DM1 for damming up the flow of the resin MRp (see FIG. 17) in the resin feed step between the through hole VTh2 and the through hole VTh1 (in the example shown in FIG. 22, between the through hole VTh3 and the through hole VTh1).

Further, preferably, in the direction DRC2, the length WDTh2 of the through hole VTh2 is larger than the length WDTh1 of the through hole VTh1, and the length WDTh2 in the direction DRC2 of the through hole VTh2 is larger than the length in the direction DRC1 of the through hole VTh2. As a result, the resin MRp which has reached the through hole VTh2 spreads along the direction DRC2. This can promote curing of the resin MRp which has flowed into the through hole VTh2.

Further, preferably, in the direction DRC2, the length WDTh4 of the through hole VTh4 is larger than the length WDTh1 of the through hole VTh1, and the length WDTh4 in the direction DRC2 of the through hole VTh4 is larger than the length in the direction DRC1 of the through hole VTh4. As a result, the resin MRp which has reached the through hole VTh4 spreads along the direction DRC2. This can promote curing of the resin MRp which has flowed into the through hole VTh4.

In the present embodiment, as shown in FIG. 22, the length WDTh2 in the direction DRC2 of the through hole VTh2 is larger than the length in the direction DRC1 of the through hole VTh2. Therefore, promotion of heat curing of the resin MRp can reduce the leakage amount of the resin MRp. Further, by reducing the leakage amount of the resin MRp, it is possible to reduce the volume of the portion of the vent resin MRv embedded in the vent part MDv of the mold die MD. As a result, it is possible to reduce the stress generated in the base material extraction step. Then, when the stress generated in the base material extraction step can be reduced, the generation of the residual resin can be suppressed.

However, when the length WDTh2 in the direction DRC2 of the through hole VTh2 shown in FIG. 22 is extremely increased, the area of the frame part LFf also increases, resulting in the reduction of the arrangement space for the leads LD. Particularly, in the case of the semiconductor device of a type in which a plurality of outer lead parts OLD protrude toward outside the tie bars TB as in the present embodiment, an increase in number of the leads LD results in a decrease in area of the frame part LFf. For this reason, the length WDTh2 in the direction DRC2 of the through hole VTh2 formed at the frame part LFf is limited. Whereas, when the length WDTh2 increases, air is accumulated in the tip portion in the direction DRC2 of the through hole VTh2. Accordingly, the resin MRp becomes less likely to reach the tip portion. Further, in the frame part LFf, a lead-out portion HL2 for supporting each suspending lead HL is provided adjacent to the plurality of through holes VTh. From the viewpoint of ensuring the support strength of the suspending lead HL, the width (the length in the X direction shown in FIG. 22) of the lead-out portion HL2 is preferably equivalent to, or larger than the width of the outer lead part OLD of the lead LD.

Therefore, the length WDTh2 in the direction DRC2 of the through hole VTh2 shown in FIG. 22 is preferably three times or less the groove width WDTv of the vent part MDv. When the length WDTh2 falls within the range of three times or less the groove width WDTv of the vent part MDv, the leakage amount of the resin MRp can be more reduced with an increase in length WDTh2.

Further, when measures for reducing the leakage amount of the resin MRp are taken as in the present embodiment, as shown in FIG. 18, the resin MRp often reach only to some through holes VTh closer to the cavities CBT of the plurality of through holes VTh. Therefore, it is essential only that some through holes VTh at a relatively shorter distance to the cavity CBT are increased in length in the direction DRC2 (see FIG. 22). For example, in the example shown in FIG. 22, the length WDTh3 in the direction DRC2 of the through hole VTh3 is preferably larger than the length in the direction DRC1 of the through hole VTh3. Whereas, the length WDTh4 in the direction DRC2 of the through hole VTh4 is preferably larger than the length in the direction DRC1 of the through hole VTh4.

However, even the through hole VTh closer to the cavities CBT of the plurality of through holes VTh may be unable to be sufficiently increased in length in the direction DRC2 due to other restrictions. For example, in the present embodiment, as shown in FIG. 22, there is a through hole VTh3 provided between the through hole VTh2 and the through hole VTh1. In the direction DRC2, the length WDTh3 of the through hole VTh3 is smaller than the length WDTh2 of the through hole VTh2.

As described above, from the viewpoint of ensuring the support strength of the suspending leads HL shown in FIG. 22, the width (the length in the X direction shown in FIG. 22) of the lead-out portion HL2 supporting the suspending lead HL adjacent to the plurality of through holes VTh is preferably equivalent to, or larger than the width of the outer lead part OLD of the lead LD. Further, in order to adapt to an increase in number of external terminals of the semiconductor device, namely, the number of the leads LD, and to suppress an increase in planar size of the package, the length in the direction DRC2 of the through hole VTh is difficult to sufficiently increase in a region close to the cavities CBT. However, when in the direction DRC1, the clearance between the through hole VTh1 and the through hole VTh provided adjacent to the through hole VTh1 becomes large, stress concentration becomes more likely to be caused in the base material extraction step. Thus, in the present embodiment, a through hole VTh3 having a length WDTh3 in the direction DRC2 shorter than the length WDTh2 is provided between the through hole VTh2 and the through hole VTh1. Incidentally, the length WDTh3 of the through hole VTh3 is preferably equal to, or larger than the groove width WDTv of the vent part MDv. For this reason, in the example shown in FIG. 22, the through hole VTh3 is provided at a position closer to the through hole VTh2 than to the through hole VTh1. In other words, the distance between the through hole VTh3 and the through hole VTh2 is shorter than the distance between the through hole VTh3 and the through hole VTh1.

On the other hand, the through holes VTh provided at a position distant from the cavities CBT of the plurality of through holes VTh provided outside the through hole VTh1 can ensure a space for increasing the length in the direction DRC2. However, in the present embodiment, for another reason, a through hole VTh having a short length in the direction DRC2 is provided at a position distant from the cavities CBT. For example, in the example shown in FIG. 22, the length WDTh6 in the direction DRC2 of the through hole VTh6 provided outside the through hole VTh4 is smaller than the length WDTh2 of the through hole VTh2.

The resin MRp (see FIG. 17) is less likely to reach the through hole VTh6 provided at a position distant from the cavities CBT of the plurality of through holes VTh in the resin feed step. Whereas, even if the resin MRp reaches the through hole VTh6, curing of the resin MRp will have proceeded by the time the resin MRp reaches the through hole VTh6. Therefore, the length in the direction DRC2 is not required to be increased.

Further, as shown in FIG. 22, when the through holes VTh are provided around the cavities CBT, a clamp part MDc is required to be arranged in such a manner as to press the periphery of the through holes VTh. However, when the plane area of the clamp part MDc, namely, each area of the clamp surfaces MDc1 and MDc2 shown in FIG. 13 is increased, the clamping force is dispersed. For this reason, the area of the clamp part MDc is preferably minimized.

Thus, in the present embodiment, the length WDTh6 in the direction DRC2 of the through hole VTh6 provided outside the through hole VTh4 is smaller than the length WDTh2 of the through hole VTh2. As a result, it is possible to reduce the plane area of the clamp part MDc in the vicinity of the through hole VTh6. Therefore, it is possible to suppress the dispersion of the clamping force as the whole clamp part MDc.

Modified Example

Up to this point, the invention completed by the present inventors was specifically described by way of embodiments. However, it is naturally understood that the present invention is not limited to the embodiments, and can be variously changed within the scope not departing from the gist thereof. Incidentally, even in the embodiments, some Modified Examples were described. However, below, a description will be given to representative Modified Examples other than the Modified Examples described in the embodiments.

For example, in conjunction with FIG. 22, a description has been given to the embodiment in which the plurality of through holes VTh each extend linearly along the direction DRC2 orthogonal to the direction DRC1. However, some or all of the plurality of through holes VTh may be in a bent shape as with a lead frame LF3 of Modified Example shown in FIG. 26. In the case of the example shown in FIG. 26, each of the through hole VTh2, the through hole VTh4, and the through hole VTh5 of the plurality of through holes VTh is in a bent shape. In the case of the example shown in FIG. 26, the direction DRC2 can be defined as a bent direction crossing with the direction DRC1.

Figure 26:
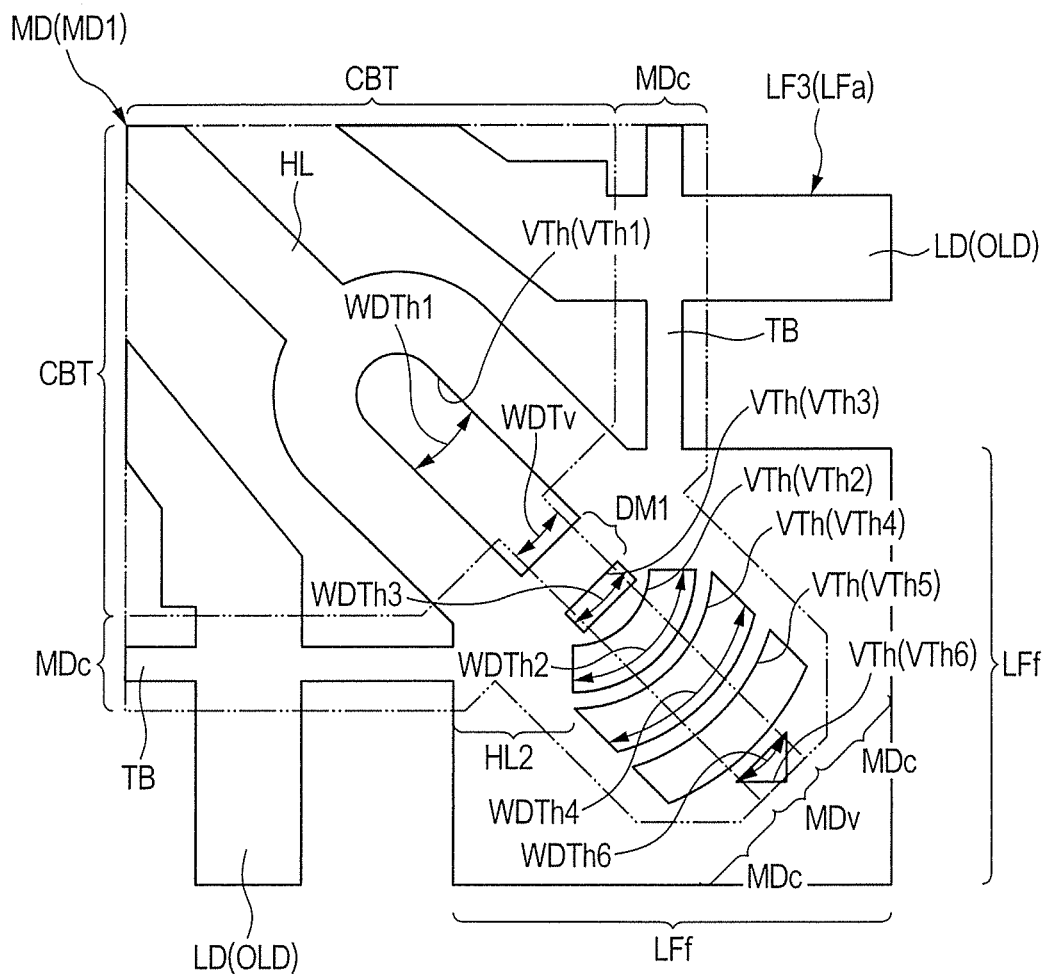
FIG. 26 is an enlarged plan view showing another Modified Example with respect to FIG. 22.

Further, as a still other Modified Example with respect to FIG. 26, some or all of the plurality of through holes VTh may be bent.

When the plan configuration of the through hole VTh is in a bent shape as shown in FIG. 26, the length in the direction DRC2 of the through hole VTh can be made larger as compared with the example shown in FIG. 22. For example, in the example shown in FIG. 26, the length WDTh2 in the direction DRC2 of the through hole VTh2, and the length WDTh4 in the direction DRC2 of the through hole VTh4 are longer than the length WDTh2 and the length WDTh4 shown in FIG. 22, respectively.

Further, for example, in the embodiment, for ease of understanding, for example, the semiconductor device has been taken up exemplarily in which nine leads per side, a total of 36 leads protrude from the four sides of the sealing body MR. However, the number of the leads is not limited thereto, and there are various Modified Examples. For example, the number of the leads may be 144, or more. Such an increase in number of leads results in a decrease in area of the frame part LFf for forming the plurality of through holes VTh therein. For this reason, resin leakage is required to be suppressed with reliability in a limited space.

Whereas, for example, in the embodiment, as an example of the semiconductor device, the embodiment in which the present invention is applied to the QFP type semiconductor device has been taken up exemplarily, and described. However, the technology is applicable to not only the QFP type but also the semiconductor devices of other various Modified Examples. For example, the technology is also applicable to a semiconductor device referred to as a SOP type in which in a plan view, the sealing body is in a rectangular shape, a plurality of leads protrude from the opposing long sides, respectively, and no lead protrudes from the opposing short sides. In this case, when a vent part is provided closer to the short side of the cavity formed in a rectangular shape in a plan view, the vent part may be provided at a given position of the short side. In this case, the restriction on the length of the through hole provided at a position overlapping the vent part is reduced as compared with the embodiments.

On the other hand, when the vent part is provided closer to the long side of the cavity formed in a rectangular shape in a plan view, as with the examples of the embodiments, the vent part is preferably provided at the end of the lead group of a plurality of protruding leads. In this case, an increase in number of the leads as with the embodiments imposes a restriction on the length of the through hole provided at a position overlapping the vent part.

Further, for example, various Modified Examples have been described as described above. However, respective Modified Examples described above are applicable in combination.

What is claimed is:
1. A method for manufacturing a semiconductor device, comprising the steps of:
    (a) providing a lead frame including a chip mounting part having a semiconductor chip mounted thereover, and a plurality of leads electrically coupled with a plurality of electrodes formed at the main surface of the semiconductor chip via a plurality of wires, respectively, and
    (b) sealing the semiconductor chip with a resin, and forming a sealing body,
    wherein the step (b) includes the steps of:
    (b1) providing a mold die having a cavity, a gate part communicating with the cavity, and a vent part provided opposite to the gate part via the cavity in such a manner as to communicate with the cavity, and extending in a first direction,
    (b2) arranging the lead frame between a first die and a second die forming the mold die such that the semiconductor chip is situated in the cavity of the mold die, and clamping the lead frame by the first die and the second die,
    (b3) after the step (b2), feeding the resin into the cavity, and
    (b4) after the step (b3), separating the first die and the second die from each other, and extracting the lead frame from the mold die,
    wherein the lead frame has a first through hole provided at a position overlapping the cavity in the step (b2), and a second through hole provided outside the first through hole with respect to the chip mounting part, and separated from the first through hole, and provided at a position overlapping the vent part in the step (b2), and
    wherein in a second direction crossing with the first direction, the length of the second through hole is larger than the length of the vent part.
2. The method for manufacturing a semiconductor device according to claim 1,
    wherein the lead frame has a plurality of through holes separated from one another at positions overlapping the vent part in the step (b2), and outside the first through hole with respect to the chip mounting part.
3. The method for manufacturing a semiconductor device according to claim 2,
    wherein respective lengths in the first direction of the through holes are smaller than respective lengths in the second direction of the through holes, respectively.

4. The method for manufacturing a semiconductor device according to claim 1,
wherein the length in the second direction of the second through hole is larger than the length in the first direction of the second through hole.

5. The method for manufacturing a semiconductor device according to claim 4,
wherein in the second direction, the length of the second through hole is equal to, or less than three times the length of the vent part.

6. The method for manufacturing a semiconductor device according to claim 1,
wherein the lead frame has a third through hole provided between the first through hole and the second through hole, and
wherein in the second direction, the length of the third through hole is smaller than the length of the second through hole.

7. The method for manufacturing a semiconductor device according to claim 6,
wherein the lead frame has a fourth through hole provided outside the second through hole with respect to the chip mounting part, and
wherein in the second direction, the length of the fourth through hole is larger than the length of the vent part.

8. The method for manufacturing a semiconductor device according to claim 7,
wherein the length in the first direction of the second through hole is smaller than the length in the second direction of the second through hole, and
wherein the length in the first direction of the fourth through hole is smaller than the length in the second direction of the fourth through hole.

9. The method for manufacturing a semiconductor device according to claim 7,
wherein the lead frame has a fifth through hole provided outside the fourth through hole with respect to the chip mounting part, and
wherein in the second direction, the length of the fifth through hole is smaller than the length of the second through hole.

10. The method for manufacturing a semiconductor device according to claim 1,
wherein the cavity is formed in a rectangular shape in a plan view,
wherein the gate part is coupled with a first corner part of four corner parts of the cavity, and
wherein the vent part is coupled with a second corner part situated diagonal to the first corner part.

11. The method for manufacturing a semiconductor device according to claim 1,
wherein the cavity is formed in a rectangular shape in a plan view,
wherein the gate part is coupled with a first corner part of four corner parts of the cavity, and
wherein the vent part is coupled with each of the second corner part, the third corner part, and the fourth corner part of the four corner parts of the cavity.

12. A method for manufacturing a semiconductor device, comprising the steps of:
(a) providing a lead frame including a chip mounting part having a semiconductor chip mounted thereover, and a plurality of leads electrically coupled with a plurality of electrodes formed at the main surface of the semiconductor chip via a plurality of wires, respectively, and
(b) sealing the semiconductor chip with a resin, and forming a sealing body,
wherein the step (b) includes the steps of:
(b1) providing a mold die having a cavity, a gate part communicating with the cavity, and a vent part provided opposite to the gate part via the cavity in such a manner as to communicate with the cavity, and extending in a first direction,
(b2) arranging the lead frame between a first die and a second die forming the mold die such that the semiconductor chip is situated in the cavity of the mold die, and clamping the lead frame by the first die and the second die,
(b3) after the step (b2), feeding the resin into the cavity, and
(b4) after the step (b3), separating the first die and the second die from each other, and extracting the lead frame from the mold die,
wherein the lead frame has: a first through hole provided at a position overlapping the cavity in the step (b2); a second through hole provided outside the first through hole with respect to the chip mounting part, and separated from the first through hole, and provided at a position overlapping the vent part in the step (b2); and a dam part provided between the first through hole and the second through hole, and for damming up the flow of a resin in the step (b3)
wherein in a second direction crossing with the first direction, the length of the second through hole is larger than the length of the first through hole, and
wherein the length in the second direction of the second through hole is larger than the length in the first direction of the second through hole.

13. The method for manufacturing a semiconductor device according to claim 12,
wherein the lead frame has a third through hole provided outside the second through hole with respect to the chip mounting part, and separated from the second through hole,
wherein in the second direction crossing with the first direction, the length of the third through hole is larger than the length of the first through hole, and
wherein the length in the second direction of the third through hole is larger than the length in the first direction of the third through hole.

14. The method for manufacturing a semiconductor device according to claim 12,
wherein the wires are each formed of gold, and each have a wire diameter of 20 μm or less.

15. The method for manufacturing a semiconductor device according to claim 1,
wherein the second through hole has a bent shape in the second direction.

16. The method for manufacturing a semiconductor device according to claim 1,
wherein the length in the second direction of the first through hole in a portion of the first through hole where it is overlapping the cavity is smaller than the length in the second direction of the second through hole, and
wherein the length in the second direction of the first through hole in a portion of the first through hole where it is facing the second through hole is larger than the length in the second direction of the first through hole in the portion of the first through hole where it is overlapping the cavity.

* * * * *